US008283960B2

(12) United States Patent
Le et al.

(10) Patent No.: US 8,283,960 B2
(45) Date of Patent: Oct. 9, 2012

(54) MINIMAL BUBBLE VOLTAGE REGULATOR

(75) Inventors: Hanh-Phuc Le, Berkeley, CA (US); Robert P. Masleid, Monte Sereno, CA (US); David Greenhill, Portola Valley, CA (US)

(73) Assignee: Oracle America, Inc., Redwood City, CA (US)

( * ) Notice: Subject to any disclaimer, the term of this patent is extended or adjusted under 35 U.S.C. 154(b) by 34 days.

(21) Appl. No.: 12/430,829

(22) Filed: Apr. 27, 2009

(65) Prior Publication Data

US 2010/0271100 A1 Oct. 28, 2010

(51) Int. Cl.
*H03H 11/26* (2006.01)

(52) U.S. Cl. ........................................................ 327/269

(58) Field of Classification Search ........................ None
See application file for complete search history.

(56) References Cited

U.S. PATENT DOCUMENTS

| | | | | |
|---|---|---|---|---|
| 3,037,166 | A | 5/1962 | Alexander | |
| 4,433,919 | A | 2/1984 | Hoppe | |
| 4,443,766 | A | 4/1984 | Belton, Jr. | |
| 4,620,180 | A | 10/1986 | Carlton | |
| 5,179,303 | A | 1/1993 | Searles et al. | |
| 5,245,231 | A | 9/1993 | Kocis et al. | |
| 5,390,178 | A | 2/1995 | Hunter | |
| 5,539,832 | A | 7/1996 | Weinstein et al. | |
| 5,694,377 | A | 12/1997 | Kushnick | |
| 5,717,729 | A | 2/1998 | Iknaian et al. | |
| 5,812,626 | A | 9/1998 | Kusumoto et al. | |
| 5,818,890 | A | 10/1998 | Ford et al. | |
| 6,426,662 | B1 | 7/2002 | Arcus | |
| 6,429,693 | B1 | 8/2002 | Staszewski et al. | |
| 6,617,936 | B2 | 9/2003 | Dally et al. | |
| 6,686,787 | B2 | 2/2004 | Ling | |
| 6,700,420 | B2 | 3/2004 | Spehar | |
| 6,836,163 | B2 | 12/2004 | Spehar | |
| 6,861,916 | B2 | 3/2005 | Dally et al. | |
| 6,963,235 | B2 | 11/2005 | Lee | |
| 7,071,789 | B2 | 7/2006 | Gu | |
| 7,205,924 | B2 | 4/2007 | Vemulapalli et al. | |
| 7,414,489 | B2 | 8/2008 | Dally et al. | |
| 7,564,284 | B2 | 7/2009 | Henzler et al. | |
| 7,595,686 | B2 | 9/2009 | Maksimovic et al. | |
| 7,683,725 | B2 | 3/2010 | Kim et al. | |
| 7,688,126 | B2 * | 3/2010 | Henzler et al. | 327/261 |
| 7,688,242 | B2 | 3/2010 | Shimizu et al. | |
| 7,719,338 | B2 * | 5/2010 | Ikeda | 327/291 |
| 7,786,816 | B2 | 8/2010 | Dally et al. | |
| 7,808,418 | B2 | 10/2010 | Sun et al. | |

(Continued)

OTHER PUBLICATIONS

Alon et al., "Circuits and Techniques for High-Resolution Measurement of On-Chip Power Supply Noise," IEEE Journal of Solid-State Circuits, vol. 40, No. 4, pp. 820-828, Apr. 2005.

(Continued)

*Primary Examiner* — Lincoln Donovan
*Assistant Examiner* — Khareem E Almo
(74) *Attorney, Agent, or Firm* — Polsinelli Shughart PC

(57) ABSTRACT

A digital voltage regulator including a dual rail delay chain having large size, feed forward cross-coupled inverters that interconnect the two rails. Stages of the delay chain include a dual-ended output that provides a data signal and a substantially simultaneous data complement signal to a flip-flop component associated with a sampling circuit. In use, the enhanced resolution delay chain and the reduced metastability window flop-flop increase the precision of the digital voltage regulator.

15 Claims, 19 Drawing Sheets

U.S. PATENT DOCUMENTS

| | | | | |
|---|---|---|---|---|
| 7,940,103 | B2 | 5/2011 | Satoh | |
| 2003/0156461 | A1 | 8/2003 | Demone | |
| 2005/0231291 | A1 | 10/2005 | Dally et al. | |
| 2008/0231328 | A1 * | 9/2008 | Leydier et al. | 327/105 |
| 2009/0021407 | A1 | 1/2009 | Terazawa et al. | |
| 2009/0108901 | A1 | 4/2009 | Ikeda | |
| 2009/0219073 | A1 | 9/2009 | Sun et al. | |
| 2010/0053097 | A1 | 3/2010 | Goh et al. | |
| 2010/0271099 | A1 | 10/2010 | Le et al. | |
| 2010/0271100 | A1 | 10/2010 | Le et al. | |
| 2011/0133973 | A1 | 6/2011 | Yamamoto et al. | |

OTHER PUBLICATIONS

Chansungsan, Chaiyuth, "Auto-Referenced On-Die Power Supply Noise Measurement Circuit," IEEE 2005 Custom Integrated Circuits Conference, pp. 39-42, 2005.

Kanno et al., "In-situ measurement of supply-noise maps with millivolt accuracy and nanosecond-order time resolution," IEEE, Symposium on VLSI Circuits Digest of Technical Papers, 2 pages, 2006.

Lan et al., "Simulation and Measurement of On-Chip Supply Noise in Multi-Gigabit I/O Interfaces," IEEE, 9$^{th}$ International Symposium on Quality Electronic Design, pp. 670-675, 2008.

Lin et al., "Full-Chip Vectorless Dynamic Power Integrity Analysis and Verification Against 100uV/100ps-Resolution Measurement," IEEE 2004 Custom Integrated Circuits Conference, pp. 509-512, 2004.

Maneatis, John G., "Low-Jitter Process-Independent DLL and PLL Based on Self-Biased Techniques," IEEE Journal of Solid-State Circuits, vol. 31, No. 11, pp. 1723-1732, Nov. 1996.

Maneatis et al., "Precise Delay Generation Using Coupled Oscillators," IEEE Journal of Solid-State Circuits, vol. 28, No. 12, pp. 1273-1282, Dec. 1993.

Muhtaroglu et al., "On-Die Droop Detector for Analog Sensing of Power Supply Noise," IEEE Journal of Solid-State Circuits, vol. 39, No. 4, pp. 651-660, Apr. 2004.

Nagata et al., "A Built-in Technique for Probing Power Supply and Ground Noise Distribution Within Large-Scale Digital Integrated Circuits," IEEE Journal of Solid-State Circuits, vol. 40, No. 4, pp. 813-819, Apr. 2005.

Ogasahara et al., "Dynamic Supply Noise Measurement Circuit Composed of Standard Cells Suitable for In-Site SoC Power Integrity Verification," IEEE, pp. 107-108, 2008.

Ogasahara et al., "Dynamic Supply Noise Measurement with All Digital Gated Oscillator for Evaluating Decoupling Capacitance Effect," IEEE 2007 Custom Integrated Circuits Conference (CICC), pp. 783-786, 2007.

Shimazaki et al., "Dynamic Power-Supply and Well Noise Measurement and Analysis for High Frequency Body-Biased Circuits," IEEE Symposium on VLSI Circuits Digest of Technical Papers, pp. 94-97, 2004.

Non-Final Office Action regarding U.S. Appl. No. 12/430,840 issued Jul. 18, 2011, 9 pages.

Restriction Requirement regarding U.S. Appl. No. 12/430,840, Apr. 11, 2011.

Amendment and Response to Restriction Requirement regarding U.S. Appl. No. 12/430,840, May 11, 2011.

Amendment and Response to Non-Final Office Action regarding U.S. Appl. No. 12/430,840, Sep. 19, 2011.

Non-Final Office Action regarding U.S. Appl. No. 12/430,854, Jul. 18, 2011.

Amendment and Response to Non-Final Office Action regarding U.S. Appl. No. 12/430,854, Oct. 18, 2011.

Non-Final Office Action regarding U.S. Appl. No. 12/430,846, Oct. 21, 2011.

Notice of Allowance regarding U.S. Appl. No. 12/430,854, Oct. 28, 2011.

Notice of Allowance regarding U.S. Appl. No. 12/430,840, Jan. 19, 2012.

Amendment and Response to Non-Final Office Action regarding U.S. Appl. No. 12/430,846, Jan. 23, 2012.

Final Office Action regarding U.S. Appl. No. 12/430,846, Feb. 3, 2012.

Notice of Allowance regarding U.S. Appl. No. 12/430,854, Feb. 13, 2012.

Non-Final Office Action regarding U.S. Appl. No. 12/430,840, Jul. 18, 2011.

* cited by examiner

MINIMAL BUBBLE VOLTAGE REGULATOR

TECHNICAL FIELD

Embodiments are generally related to digital voltage regulators, and more specifically to methods and apparatus for regulating voltages within an integrated circuit.

BACKGROUND

An integrated circuit is typically designed to operate within a range of values for a number of different parameters. One such parameter is the voltage associated with the integrated circuit's power supply. Operating outside of a predetermined range of power supply voltages may result in improper operation of the integrated circuit. In order to prevent an integrated circuit from operating outside of the appropriate range of power supply voltages, the integrated circuit may be operated to periodically determine the voltage of the power supply. Improper operation of the integrated circuit may be prevented by slowing or halting the circuit's power consumption in response to measurements that indicate the power supply voltage is outside of the operating range.

The accuracy and/or operating efficiency of an integrated circuit may depend on the precision at which an integrated circuit is able to determine its own power supply voltage. If a measurement is taken that indicates the power supply voltage is in a permitted operating range when in fact it is not, incorrect calculations or data values may be produced by the integrated circuit. If a measurement is taken that indicates the power supply voltage is not in the permitted operating range when in fact it is, inefficient operation of the integrated circuit may result due to the fact that operations may be slowed or halted unnecessarily.

In determining power supply voltages, an integrated circuit may employ voltage-to-time conversion techniques. Here, a voltage is estimated based on the behavior of circuit elements whose operating speed varies with power supply variations in a predictable manner. More particularly, the operating speed of a number of circuit elements is measured over a fixed interval of time. Based on the measured operating speed, a voltage estimate may be obtained. The precision of the measurements depends on both the number of data points that can be taken and on the ability to observe as many of the data points as possible.

Conventional voltage-to-time conversion techniques may utilize delay circuits such as the inverter chain 100, shown in FIG. 1. The inverter chain 100 includes a number of inverters 104 interconnected in a chain. The inverter chain 100 may be sampled at intermediate points 108, which are located between the output of a given inverter 104 and the input of a subsequent inverter 104. The inverter chain 100 may be sampled at intermediate points 108 by a state element such as a flip-flop. In some configurations, a flip-flop evaluates based on a data signal and a complementary data bar signal. In conventional configurations, the data signal is received as an input and the data complement signal is internally generated. FIG. 2 is an illustration of a discrete portion 200 of a conventional flip-flip that may be used to internally generate the data complement signal. The flip-flop portion 200 includes a data line 204 that is received as an input to the flip-flop. In connection with voltage-to-time techniques, the data line 204 may be connected to a given intermediate point 108 in the delay chain 100. The flip-flop portion 200 includes an inverter 208, which receives the data line 204 as an input and produces a data complement line 212 as an output. The flip-flop portion 200 additionally includes differential pair transistors 216 (*a,b*). The first differential pair transistor 216*a* is connected to the data line 204 and the second differential pair transistor 216*b* is connected to data complement line 212. The flip-flop evaluates based on signals output from the differential pair transistors at outputs 220(*a,b*).

SUMMARY

Embodiments are directed to a digital voltage regulator, which may be used in connection with an integrated circuit. A digital voltage regulator embodiment as discussed herein includes a dual rail delay chain having cross-coupled inverters that interconnect the two rails. Delay chain embodiments include cross-coupled inverters that are part of a feed forward signal path between the two rails and are of a larger size than inverters associated with the two rails. The large size feed forward cross-coupled inverters contribute to an enhanced resolution of the delay chain. Initialization circuit embodiments convert from a single-sided signal domain to a dual-sided signal domain used by a dual rail delay chain. Stages of the delay chain include a dual-ended output that provides a data signal and a substantially simultaneous data complement signal to a flip-flop component associated with a sampling circuit. By having a data and a data complement signal that are substantially simultaneous as an input, the flip-flop's metastability may be improved by not including standard flip-flop components that are typically needed to generate an internal data complement signal. In use, the enhanced resolution delay chain and the reduced metastability window flop-flop increase the precision of the digital voltage regulator embodiment.

One embodiment is directed to a digital voltage regulator component of an integrated circuit, the integrated circuit having a power supply and logic circuits, the digital voltage regulator comprising: a delay chain having a data delay rail and a data complement delay rail, the data and data complement delay rails being interconnected through pairs of cross-coupled inverters, wherein the delay chain includes a plurality of stages; a sampling circuit having a plurality of differential input flip-flops each connected to a corresponding stage of the delay chain, wherein each differential input is connected to a data output and data complement output associated with the corresponding stage of the delay chain; and a decoder circuit having a plurality of inputs, each input connected to an output of a corresponding differential input flip-flop in the sampling circuit, wherein the decoder circuit is operable to calculate a power supply voltage based on the plurality of inputs, the decoder circuit including an output that when asserted indicates that a power supply voltage has fallen below a predetermined threshold value.

One embodiment is directed to a method of regulating voltage in an integrated circuit, comprising: propagating a data signal wavefront in a multistage delay chain at a rate having a wavefront delay that is less than a fan-out one delay for transistors associated with the stages of the delay chain; sampling each stage of the delay chain with a circuit having a metastability window that is less than the wave front delay to form a sampled data value; comparing the sampled data value to a data value indicative of a threshold voltage to determine if a power supply voltage is below the threshold voltage; and in response to determining that the power supply voltage is below the threshold voltage, reducing a power supply load.

One embodiment is directed to a digital voltage regulator component of an integrated circuit, the integrated circuit having a power supply and logic circuits, the digital voltage regulator comprising: means for propagating a signal in a delay chain with a speed corresponding to a one half fan out one stage delay; means for sampling connected to the means for propagating, the means for sampling having metastability window of less than a stage delay associated with the means for propagating; and means of decoding connected to the means for sampling, the means for decoding being operable to estimate a power supply voltage based on a delay chain value sampled by the means for sampling, and being operable to assert an output that indicates that the power supply voltage has fallen below a predetermined threshold value.

DETAILED DESCRIPTION

Figure 1:
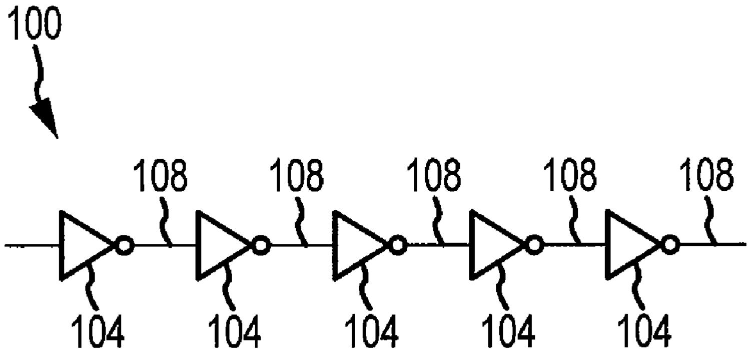
FIG.1 (PRIOR ART)
FIG. 1 is a schematic illustration of a prior art delay chain.

Embodiments discussed herein are directed to digital voltage regulator circuits. Digital voltage regulator circuits may be deployed in connection with an integrated circuit and used to prevent the integrated circuit's power supply from dropping below a certain threshold voltage. During heavy usage or heavy loading conditions, digital logic circuits or other components of an integrated circuit may demand high amounts of power from the integrated circuit's power supply. In these high usage conditions, an excessive amount of current may be drawn from the power supply resulting in a drop in the voltage of the power supply. If the voltage of the power supply drops below a certain level, the reduced power supply voltage may be insufficient to insure proper operation of the integrated circuit. Accordingly, integrated circuits typically include voltage regulator circuits that prevent these low voltage conditions from occurring.

Overview

A digital voltage regulator circuit may include a delay chain component provided in association with a sampling circuit component. In one embodiment, the delay chain component includes a series of interconnected stages. Like other components, each stage of the multistage chain is powered by the integrated circuit's power supply. The delay that a signal or wavefront experiences when propagating through each stage of the multistage delay chain may depend on fluctuations in the power supply voltage. The higher the power supply voltage, the faster a signal will propagate through a particular delay chain stage. With this in mind, the delay chain may be used to determine the power supply voltage by measuring the progress of a wavefront down the chain. At a first time instance, a wavefront is initiated at the beginning of the multistage delay chain. At a second time instance, the progress of the wavefront down the delay chain is measured.

Measuring the progress of the wavefront down a delay chain may be accomplished by an associated sampling circuit. A sampling circuit in one implementation includes a number of state elements, such as flip-flops. Each stage in the delay chain includes an output that is connected to an input of a corresponding state element or flip-flop in the sampling circuit. The state elements or flip-flops are each clocked by a signal that causes them to sample their inputs at a predetermined time. A digital voltage regulator may be calibrated so that the state elements sample their inputs at a point in time in which the wavefront has partially propagated down the delay chain. More particularly, the wavefront that is initiated in the delay chain at a first time instance is sampled by the sampling circuit at a second time instance. In sampling the delay chain, a captured delay chain value is stored by the sampling circuit. Each flip-flop holds one bit and together the total number of bits represent this captured delay chain value.

In one particular implementation, the delay chain value captured by the sampling circuit may be provided as an input to a delay chain decoder. The delay chain decoder uses the captured delay chain value to make a decision regarding the power supply voltage. If the captured delay chain value indicates that the voltage of the power supply has dropped below a certain threshold value, the delay chain decoder determines that the chip or integrated circuit may be operating at an impermissibly low power supply voltage. Based on this determination, one or more operations may be taken to mitigate the low voltage condition.

Figure 3:
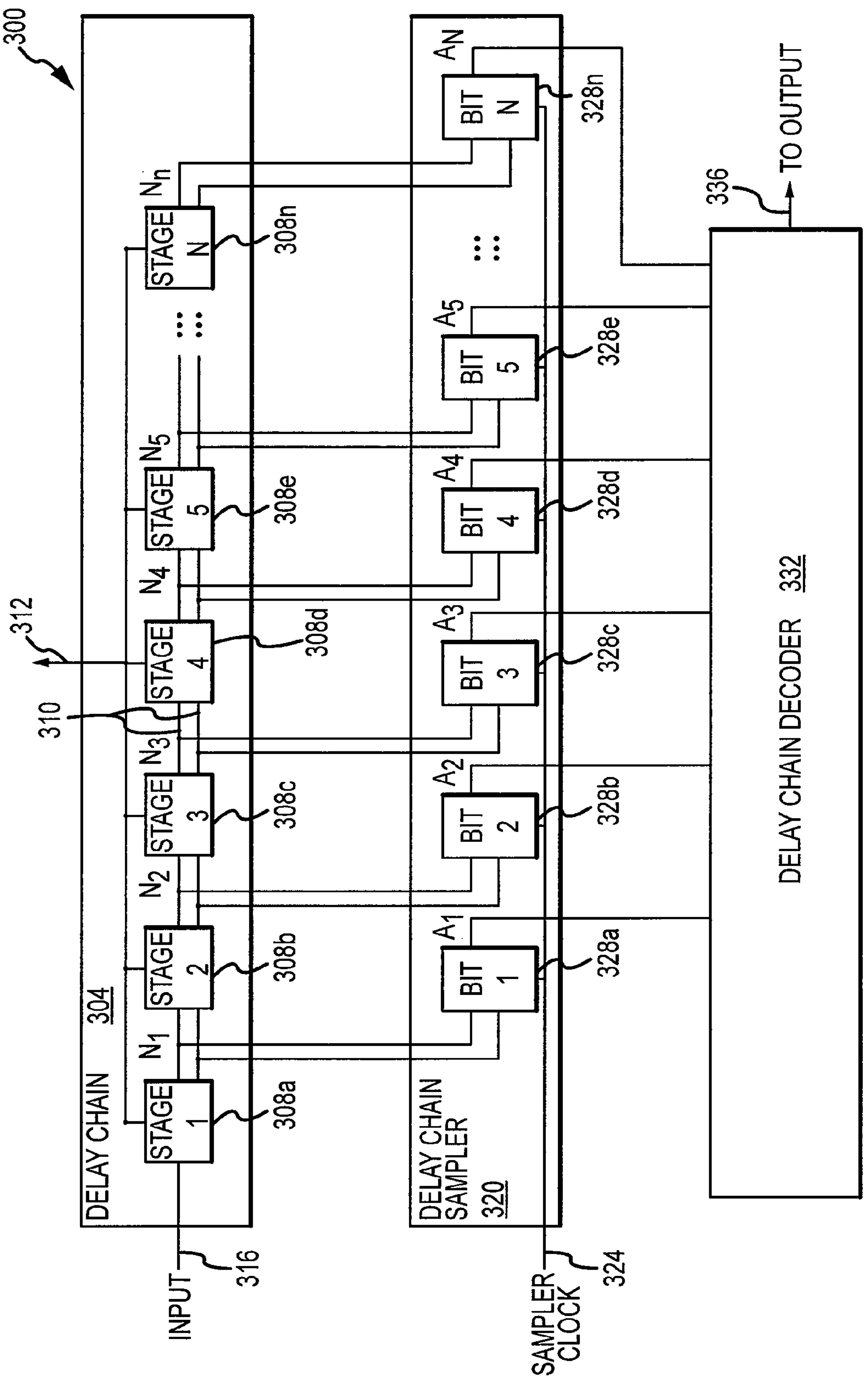
FIG. 3 is a schematic illustration of a voltage-to-time conversion circuit.

These digital voltage regulator concepts can be understood with reference to the digital voltage regulator circuit 300, which is shown in FIG. 3. The digital voltage regulator circuit 300, shown in FIG. 3, includes a delay chain 304 having a series of stages 308*a-n*. Each stage 308*a-n* includes a dual rail output 310 that may be connected as an input to a subsequent stage 308*a-n* in the delay chain 304. A given stage 308*a-n* may be powered by the integrated circuit's power supply 312. Delay through each stage 308*a-n* depends on fluctuations in the power supply 312 voltage. Each stage 308*a-n* may include a circuit element such as a pull-up and/or a pull-down transistor (not shown). These transistors have a switching time that is affected by variations in the power supply 312 voltage.

A higher power supply 312 voltage will result in a faster switching time. A lower power supply 312 voltage will result in a slower switching time. Hence, the delay through a stage 308*a-n* will be less in a higher power supply voltage situation than the delay in a respectively lower power supply situation.

In operation, a wavefront may be initiated in the delay chain 304 through the delay chain input 316 at a first time instance. The progress of the wavefront through the delay chain 304 may be measured at a second time instance by a sampling circuit 320. The second time instance may correspond to the rising edge of a clock that is received at the sampler clock input 324. The digital voltage regulator circuit shown in FIG. 3 may be adapted to respond to power supply fluctuations in a single clock cycle. Accordingly, the delay chain input 316 and the sampler clock input 324 may originate from or be tied to a system clock of the integrated circuit of which the voltage regulator 300 is a component.

As shown in FIG. 3, the sampling circuit 320 includes a number of dual input state elements 328*a-n*. Each stage 308*a-n* of the delay chain 304 is connected to a corresponding state element 328*a-n* associated with the sampling circuit 320. Each state element 328*a-n* holds one bit and together the total number of bits represent a delay chain value captured at the second time instance. Once the state elements 328*a-n* associated with the sampling circuit 320 have triggered, the result is fed into a delay chain decoder circuit 332. The delay chain decoder circuit 332 receives the captured delay chain value from the sampling circuit 320. Based on the captured delay chain value, the delay chain decoder 332 makes a digital decision to determine if the power supply 312 voltage has fallen below a predetermined threshold amount. If in fact the power supply 312 voltage has fallen below the threshold amount, the delay chain decoder 332 may assert an output 336 that initiates one or more operations that reduce the demand on the power supply 312.

Figure 4A:
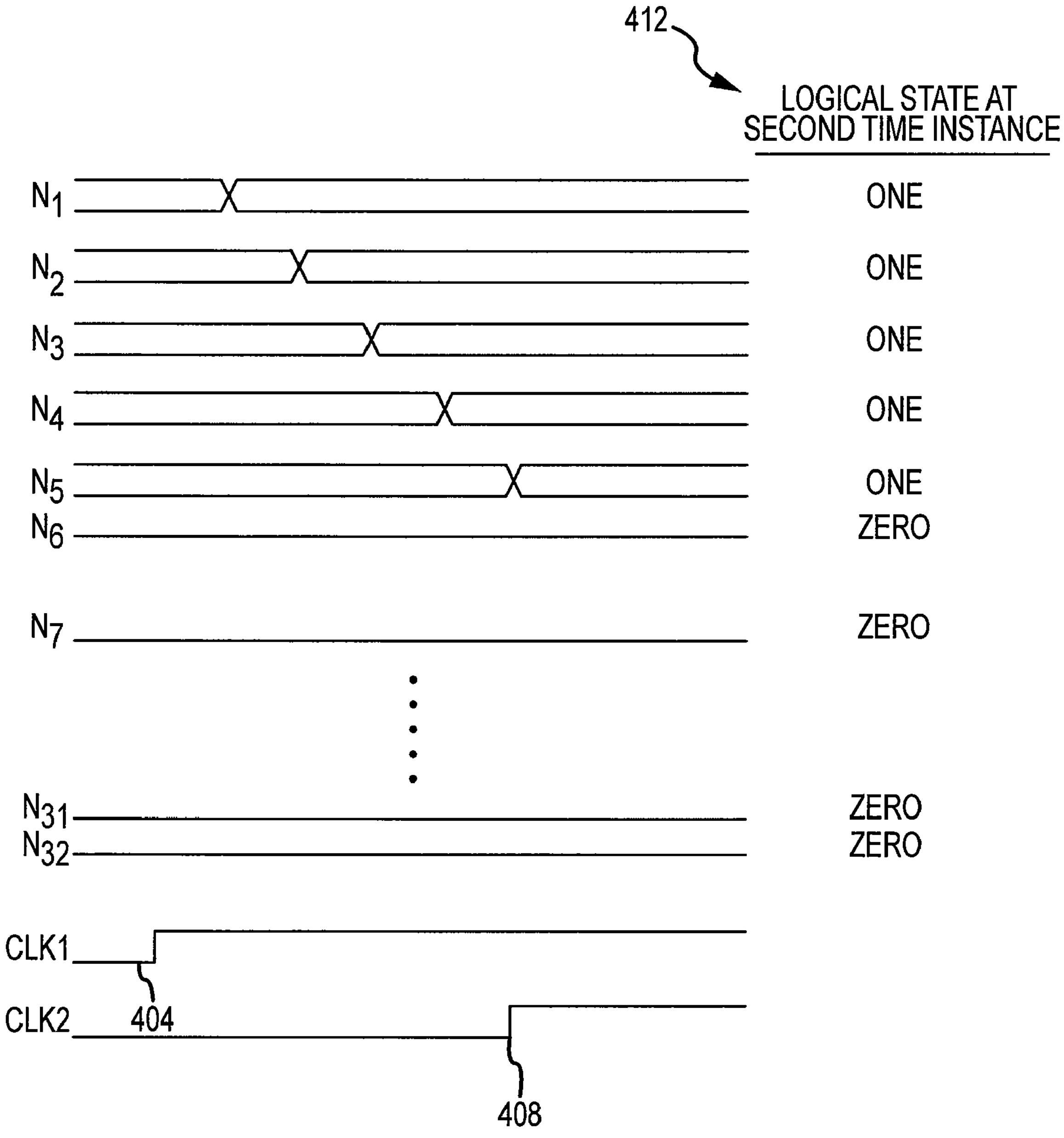
FIG. 4*a* and FIG. 4*b* are a timing diagrams that illustrate the progress of a wavefront down a delay chain component shown in FIG. 3.
Figure 4B:
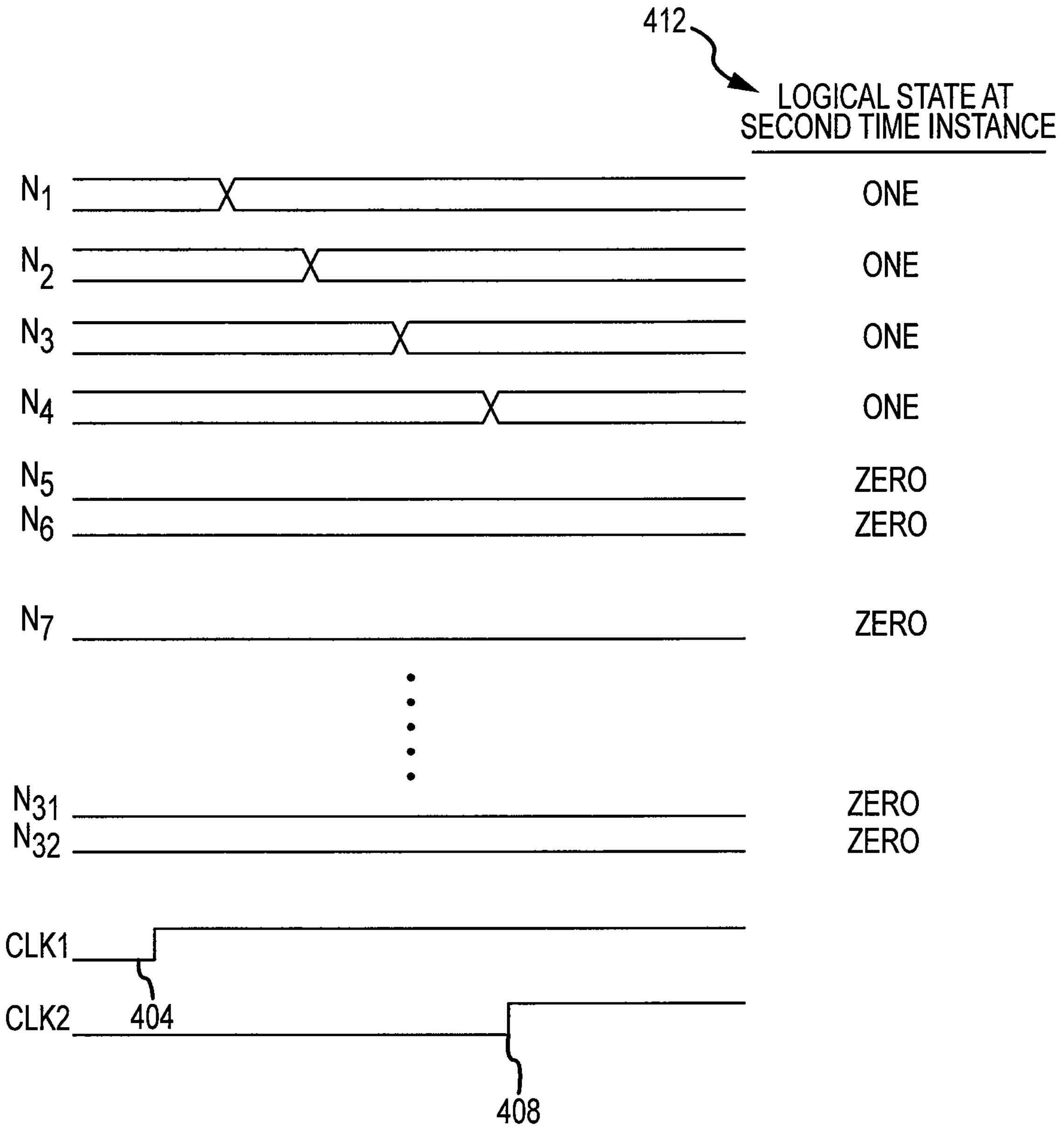

FIG. 4A and FIG. 4B illustrate the progress of a wavefront down the delay chain 304 for different power supply voltages. FIG. 4A and FIG. 4B are timing diagrams that illustrate the behavior of signals (N1, N2, N3, . . . ) at each stage 308*a-n* of the delay chain 304. Also shown in FIG. 4A and FIG. 4B is a first clock edge 404 indicative of a first time instance, at which the wavefront is initiated in the delay chain 304. Additionally, a second time instance is indicated by a second clock edge 408, which is received by the sampling circuit 320 and causes the sampling circuit 320 to sample the delay chain 304. FIG. 4A and FIG. 4B illustrate the signals present in each stage 308*a-n* of the delay chain 304 during the time between the first time instance 404 and the second time instance 408. More specifically, FIG. 4A and FIG. 4B illustrate the progress of the wavefront down the delay chain 304 that occurs during the two time instances 404, 408. The logical values carried by the individual delay chain stages 308*a-n* are given in column 412 located to the right of the timing diagram. As can be seen in FIG. 4A and FIG. 4B, those stages in the delay chain 304 that experience a transition that occurs between the first time instance 404 and the second time instance 408 carry a logical value of ONE. Delay chain 304 stages that do not experience a transition that occurs between the first time instance and the second time instance are interpreted as having a logical value of ZERO.

FIG. 4A and FIG. 4B illustrate examples of wave propagation down the delay chain 304 for different voltage levels of the power supply 312. In FIG. 4A, the power supply voltage is at a higher level. In FIG. 4B, the power supply 312 voltage is at a lower level. With a lower power supply 312 voltage, the delay through each stage 308*a-n* of the delay chain 304 is longer in picoseconds. With a lower power supply 312 voltage, the wavefront is able to propagate through a fewer number of stages 308*a-n* of the delay chain 304 during the interval between the first time instance 404 and the second time instance 408. This longer propagation through the delay chain 304 leads to a fewer number of stages 308*a-n* transitioning before the second time instance 408. This is reflected in the logical values present on signal lines (N1, N2, N3, . . . ) of stages 308*a-n* of the delay chain 304. Comparing FIG. 4A and FIG. 4B, a greater number of logical stages carry a logical value of ONE in the higher voltage case illustrated in FIG. 4A.

With this operation of the digital voltage regulator 300 in mind, several embodiments are discussed below. A fine grain timing chain is first discussed. Following this, an initialization circuit embodiment is discussed that may be used in connection with the fine grain timing chain embodiment. A combination of the fine grain timing chain and the initialization circuit are briefly discussed in connection with a digital voltage regulator embodiment. Prior to a general discussion of the digital voltage regulator embodiment, a precision sampler is discussed.

Fine Grain Timing Chain

Figure 5:
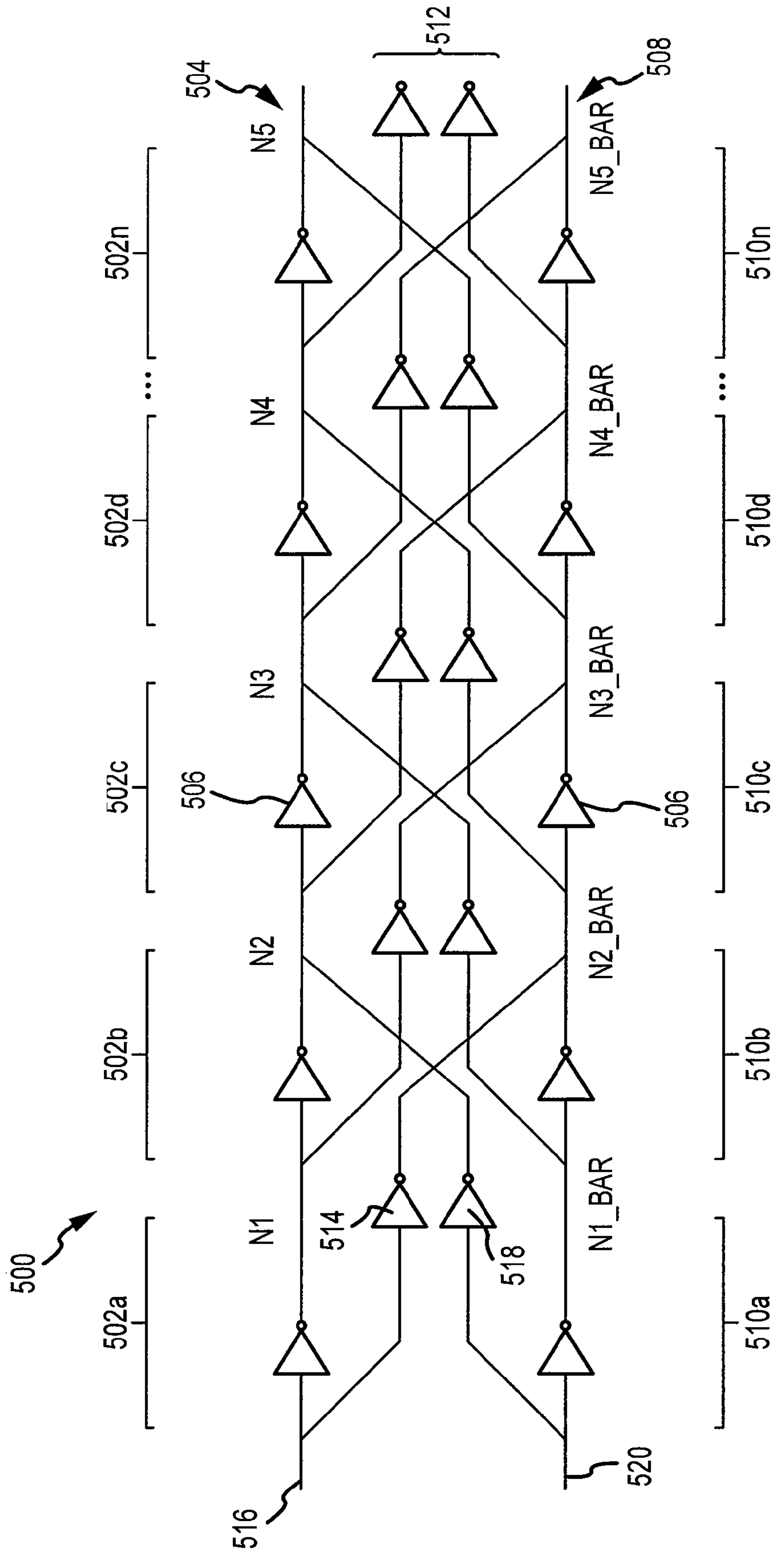
FIG. 5 is an illustration of a delay chain embodiment.

Implementations discussed herein may involve a fine grain timing chain. One embodiment of a fine grain timing chain is shown in FIG. 5. The fine grain timing chain illustrated in FIG. 5 is generally referred to with reference numeral 500 and includes two delay chains rails interconnected by means of cross-coupled inverters. With reference to FIG. 5, the first delay chain includes a chain of interconnected of stages 502*a-n* each having a rail inverter 506. The first delay chain is referred to as the data delay rail 504. The second delay chain includes a chain of interconnected stages 510*a-n* each having a rail inverter 506. The second delay chain is referred to as the data complement delay rail 508. The delay chain 500 additionally includes a number of cross-coupled inverter pairs 512.

As can be seen in FIG. 5, each cross-coupled inverter pair 512 interconnects the data delay rail 504 with the data complement delay rail 508. A particular cross-coupled inverter 512 connects a stage 502*a-n* in the data delay rail 504 to a stage 510*a-n* in the data complement delay rail 508, or connects a stage 510*a-n* in the data complement delay rail 508 to a stage 502*a-n* in the data delay rail 504. In the delay chain shown in FIG. 5, each cross-coupled inverter pair 512 feeds forward two stages in the delay chain 500. As used herein "feed-forward" refers to a circuit path or element that connects a first circuit node to a second circuit node, the second node being ahead of or "downstream" from the first node with respect to the flow of information in the circuit. With respect to the delay chains, a feed-forward element or path may advance information down the chain a certain number of stages and in so doing bypass intermediate stages. "Feed-forward-x" is a term used herein to describe this circuit arrangement, wherein "x" refers to the number of stages that are bypassed. With reference to the first cross-coupled inverter pair 512, the first inverter 514 in the first cross-coupled inverter pair 512 feeds forward a signal from the initial input 516 on the data delay rail 504 forward past the second stage 510*b* to the input of the third stage 510*c* of the data complement delay rail 508. Similarly, the second inverter 518 of the first cross-coupled inverter pair 512 feeds forward a signal from the initial input 520 on the data complement delay rail 508 forward past the second stage 502*a* to the third stage 502*c* of the data delay rail 504. This feed-forward-two characteristic is repeated for subsequent pairs of cross-coupled inverter pairs 512.

In accordance with implementations discussed herein, the delay chain 500 includes cross-coupled inverter pairs 512 that are physically larger in silicon than the rail inverters 506. More particularly, the transistors associated with the cross-coupled inverter pairs 512 are larger in comparison to the transistors associated with the rail inverters 506. The cross-coupled inverter pairs 512 are chosen to be sufficiently large in comparison to the rail inverters 506 such that the cross-coupled inverter pairs 512 dominate over the rail inverters 506. Typically, the transistors of the cross-coupled inverter pairs 512 are at least ten times larger than the transistors of rail inverters 506. This at least ten-to-one size difference achieves a reduced stage delay, as described in greater detail below.

By linking the two delay chain rails 504, 508 together by relatively larger cross-coupled feed-forward inverter pairs 512, improvements in stage delay can be achieved. Stage delay may be described in terms the "fan-out delay" associated with particular circuit elements. Fan-out delay is a term used to describe the delay through a circuit element, such as a transistor. The fan-out delay involves the ratio of a transistor's drive capacity to the transistor's load size. Transistors such as those associated with a CMOS inverter present a drive current and a capacitive load. For inverter chains that include inverters with outputs connected to inputs of identical inverters, the drive strength of a particular inverter can be described in terms of a drive current versus a capacitive load associated with the inverter's transistors. A fan-out one stage delay refers to a delay that corresponds to the drive strength an inverter loaded with an inverter like itself. In particular, a fan-out one stage delay corresponds to the drive strength of the inverter verses the capacitive input load of an inverter of the same size. A fan-out delay remains substantially constant over device sizes. If a transistor size is doubled, its drive strength is doubled and its load capacitance is doubled. Here no affect is had on the stage delay. The ratio of these two values remains the same. Accordingly, the delay experienced by a signal propagating through an inverter chain may be described in terms of fan-out one stage delay of the inverters in the chain.

With this in mind, it can be seen that an expected upper limit to the speed in which a wavefront propagates through a delay chain corresponds to the fan-out one stage delay for the transistors in the delay chain. This is the case for the delay chain 100, shown in FIG. 1. The delay chain 100 includes a number of stages that include inverters 108 having outputs that connect to inputs of inverters 108 of the same type. Accordingly, the delay through each stage is at least a fan-out one stage delay. Accordingly, in prior art configurations such as the delay chain 100 shown in FIG. 1, sub-fan-out one stage delays are not achievable or expected.

Unexpectedly, it has been found that in the circuit configuration shown in FIG. 5 with a feed-forward-two configuration and transistors of the cross-coupled inverters 512 having an approximately ten times larger size than the transistors of the rail inverters 506, an approximately one-half fan-out one stage delay is achieved. It is found that as the ratio between the size of the transistors of the cross-coupled inverters pairs 512 to the size of the transistors of the rail inverters 506 increases, the stage delay approaches one-half fan-out one asymptotically. However, due to other considerations, such as power dissipation, it may not be beneficial to choose arbitrarily large transistors for the cross-coupled inverter pairs 512. In one embodiment, the transistors of the cross-coupled inverter pairs 512 are approximately ten times larger than the transistors of rail inverters 506. In this embodiment, a stage delay of greater than ninety percent of one-half fan-out one is achieved. In other embodiments where increased power consumption may be more tolerable, the cross-coupled inverter pairs 512 may be larger than ten times the size of the rail inverters 506. In one particular embodiment, the cross-coupled inverter pairs 512 are thirty-two times the size of the rail inverters 506. In this embodiment, a stage delay of greater than ninety-eight percent of one-half fan-out one is achieved.

The circuit configuration shown in FIG. 5, achieves sub-fan-out one stage delays, which are not possible in prior art delay chains, such as the delay chain 100 shown in FIG. 1. Sub-fan-out one stage delays are achieved by the large size cross-coupled inverters 512 that force signals or information downstream through the delay chain 500 sooner than the signals would typically arrive. Also, unexpectedly, it is found that no short circuit is thereby created; instead, the feed forward signal beneficially enhances the signal transitions at each stage. Information is sent further and faster along the delay chain 500 than is possible in prior art configurations.

In addition to fast propagation speeds, the circuit configuration in FIG. 5 additionally produces a signal concurrently with a complement of the signal. Producing simultaneous complements is advantageous when the delay chain 500 is sampled. It is an aspect of the circuit configuration shown in FIG. 5 that the delay associated with a particular stage, e.g. stages 502_a-n_ and/or stage 510_a-n_, depends on the delays associated with each prior stage. In this progressive delay orientation, device size variations that may be present at a particular stage affect all stages that subsequently occur. This can be advantageous in keeping the data and data complement signals both symmetrical and simultaneous. As used herein, a dual-sided or differential signal is said to be substantially "simultaneous" if a transition on one line of the dual-sided signal begins at substantially the same time as the corresponding transition on the other line of the dual sided signal. Moreover, a dual-sided or differential signal is said to be substantially "symmetrical" if a transition on one line is completed in the same amount of time that the corresponding transition on the other line is completed. In this context, the term "substantially" generally indicates that two signals occur within one-half a stage delay of each other. Accordingly, the term "substantially simultaneous" indicates that the two lines of the dual-sided signal begin transitioning within one-half a stage delay of each other. Similarly, the term "substantially symmetrical" indicates that the two lines of the dual-sided signal transition at a rate that results in the transitions ending within one-half a stage delay of each other. It is the case that the precise dimensions for a particular transistor of a given stage cannot be known definitively. Rather, at each particular stage, process variations lead to variations in device dimensions within a certain tolerance or range. With a circuit having the progressive delay arrangement of FIG. 5, the effects of variations in device sizes at the individual stages are averaged out as a wavefront propagates down the delay chain 500. Moreover, in the progressive delay arrangement, a particular process variation impacts the signals in both rails 504,508 equally, neither slowing nor accelerating either with respect to the other. In this way, the signals remain substantially symmetrical and substantially simultaneous. Accordingly, in the circuit configuration shown in FIG. 5, the progressive delay characteristic leads to a symmetrical and simultaneous propagation of the data signal and the data complement signal.

The embodiment illustrated in FIG. 5 includes cross-coupled inverter pairs 512 having a feed-forward-two characteristic. Implementations discussed herein include circuit configurations with larger feed forward characteristics. The circuit configuration shown in FIG. 6 includes a feed-forward-four characteristic. The delay chain 600 shown in FIG. 6 includes a data delay rail 604 having stages 602_a-n_ and a data complement delay rail 608 having stages-610_a-n_. The data 604 and data complement 608 delay rails are interconnected through cross-coupled inverter 612 pairs. With reference to the first cross-coupled inverter 612 pair, the first inverter 614 in the pair feeds a signal forward from the initial signal input 616 on the data delay rail 604 to the input of the fifth stage 610*e* of the data complement delay rail 608. Similarly, the second inverter 618 in the first cross-coupled inverter 612 pair feeds the initial data input 620 signal on the data complement delay rail forward to the input of the fifth stage 602*e* of the data delay rail 604. This feed-forward-four characteristic is repeated similarly for subsequent pairs of cross-coupled inverter 612 pairs.

Figure 7:
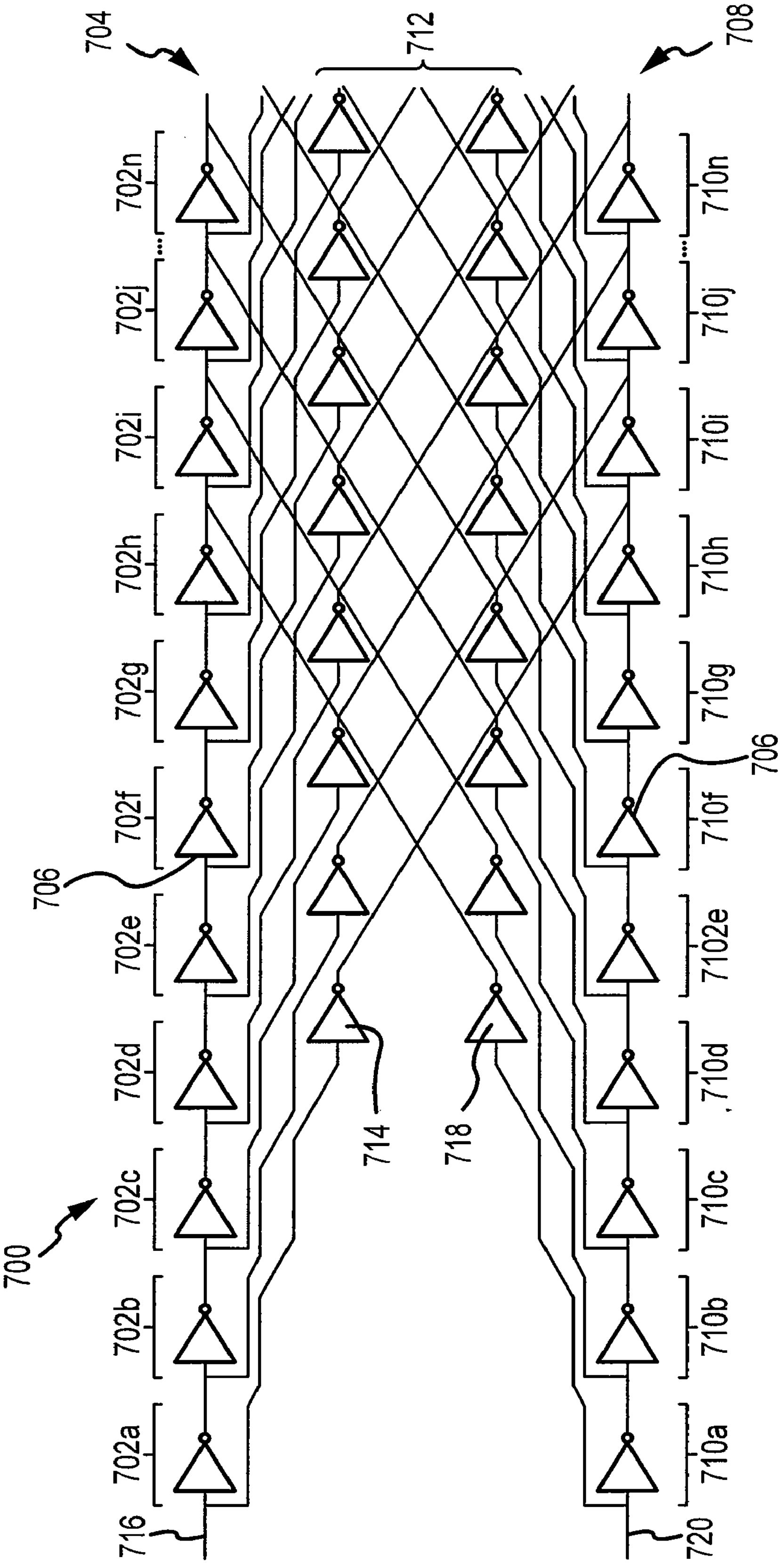
FIG. 7 is an illustration of yet another delay chain embodiment.

FIG. 7 includes a circuit configuration with a feed-forward-eight characteristic. The delay chain 700 shown in FIG. 7 includes a data delay rail 704 having stages 702*a-n* and a data complement delay rail 708 having stages 710*a-n*. The data 704 and data complement 708 delay rails are inter-connected through cross-coupled inverter 712 pairs. With reference to the first cross-coupled inverter 712 pair, the first inverter 714 in the pair feeds forward a signal from the initial input 716 on the data delay rail 704 forward to the input of the ninth stage 710 of the data complement delay rail 708. Similarly, the second inverter 718 of the first cross-coupled inverter 712 pair feeds forward a signal from the initial input 720 on the data complement delay rail 708 forward to the input of the ninth stage 702*i* of the data delay rail 704. This feed-forward-eight characteristic is repeated for subsequent pairs of cross-coupled inverter 712 pairs.

Figure 6:
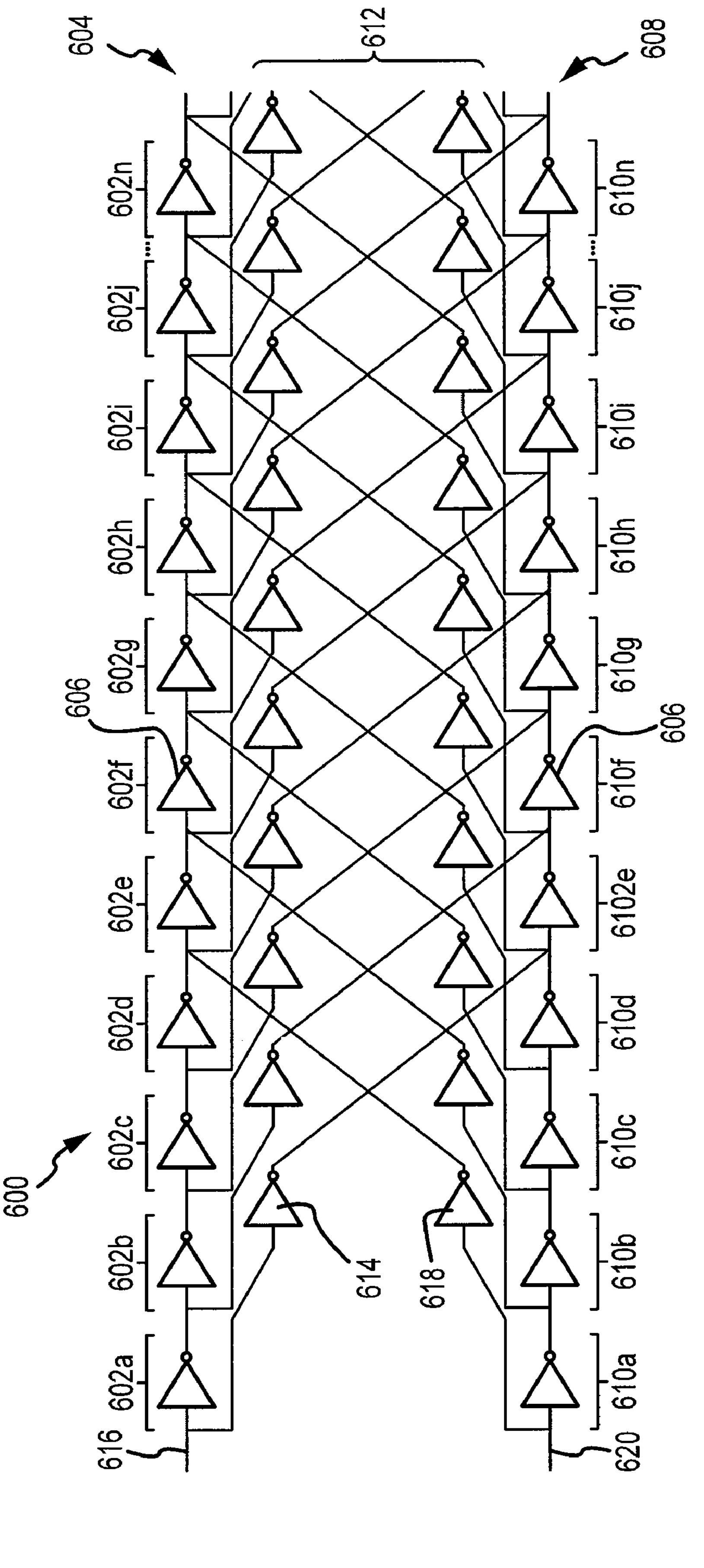
FIG. 6 is an illustration of another delay chain embodiment.

As is the case with the circuit configuration shown in FIG. 5, the feed-forward-four circuit configuration shown in FIG. 6 and the feed-forward-eight circuit configuration shown in FIG. 7 include cross-coupled inverter pairs 612, 712, respectively, having larger sizes in comparison to the inverters 606, 706 associated with the data delay rails 604, 704 and the data complement delay rails 608, 708. Typically, the cross-coupled inverter pairs 612, 712 are ten times or larger than the rail inverters 606, 706. In one particular embodiment, the cross-coupled inverter pairs 612, 712 are thirty-two times larger than the rail inverters 606, 706*t*. The large-size feed-forward cross-coupled inverters produce a sub-fan-out stage delay at the stages of the delay chains 600 and 700. In the feed-forward four orientation of FIG. 6, a one-forth fan-out one stage delay is achieved. In the feed-forward eight orientation of FIG. 7, a one-eight fan-out one stage delay is achieved.

The circuit configurations shown in FIGS. 5-7 achieve a sub-fan-out one stage delay. With this shortened stage delay, a signal or wavefront propagates through each stage at a higher speed. With specific reference to the feed-forward-two delay 500, a wavefront passes through each stage of the delay chain 500 at a faster speed and thus is able to produce a higher resolution. Specifically, a smaller increment will be present between possible discrete values that can be sampled from the delay chain 500. Accordingly, it is possible to determine the power supply voltage with greater precision. The resolution of the delay chain 500 is dependent on the individual delays through each stage of delay chain 500. With shorter stage delays, a greater number of individual stages may be present in the delay chain 500 and thus a greater number of bits may be present in the captured logical value read by an associated sampling circuit. Accordingly, the shorter the delay, or equivalently, the faster a wavefront propagates through the delay chain 500, the higher the delay chain 500 resolution will be. This aspect of the delay chain 500 is illustrated in FIG. 8

Figure 8:
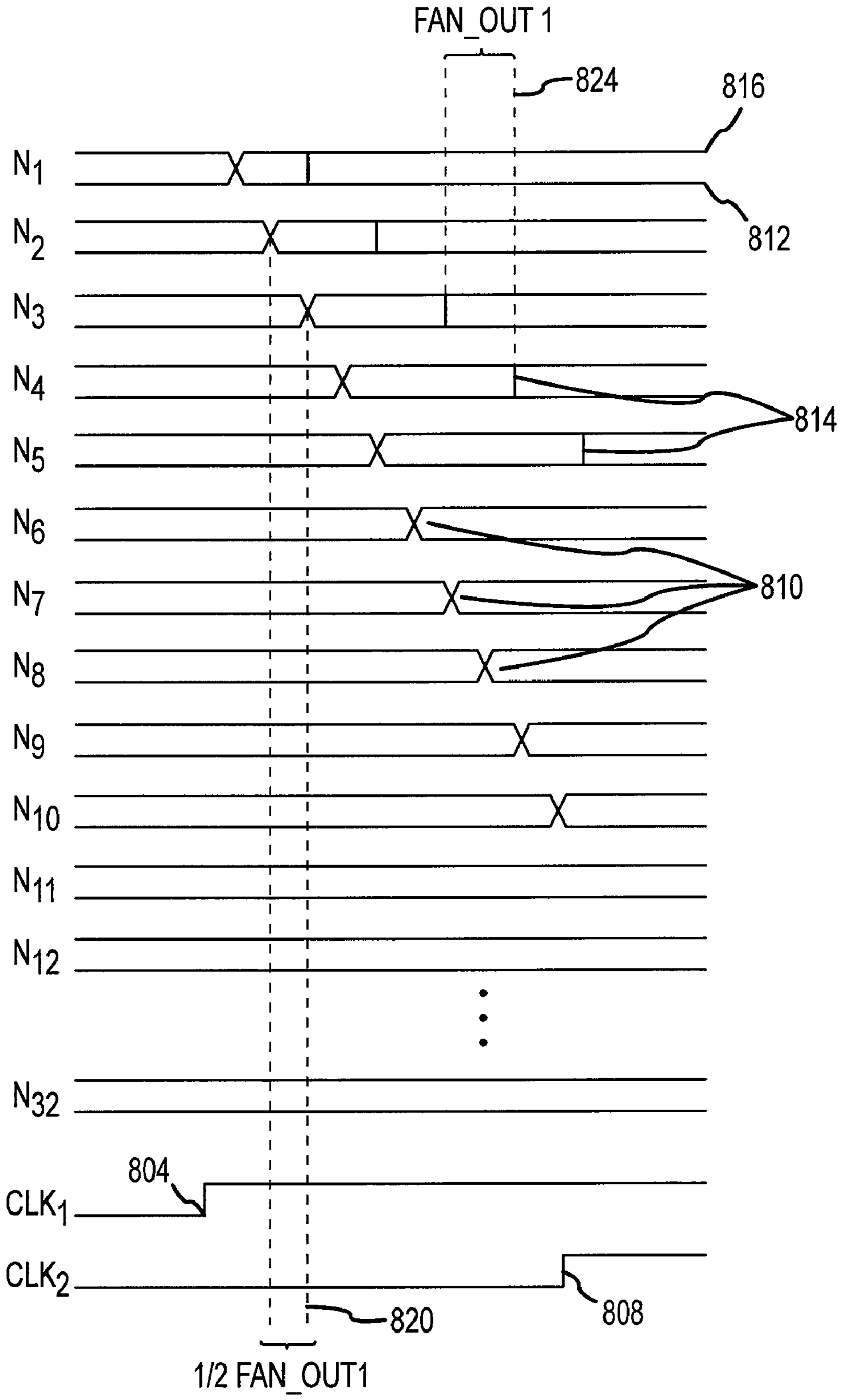
FIG. 8 is a timing diagram showing progress of a wavefront down the delay chain embodiment shown in FIG. 7.

FIG. 8 is a timing diagram showing the propagation of a wavefront down the delay chain 500 shown in FIG. 5. The wavefront begins propagating in the delay chain 500 subsequent to a first time instance 804, which corresponds to a trigger signal or clock edge that occurs at an input to the delay chain 500. As shown in FIG. 8, each stage of the delay chain 500 includes a data 812 and a data complement 814 signal, both of which transition as the wavefront propagates through the delay chain 500 stage. After the first time instance 804, a wavefront propagates down the chain 500, as shown by the successive transitions 810 of signals (N1, N2, N3, . . . ) at the individual delay chain 500 stages. FIG. 8 additionally illustrates the approximate one-half fan-out one stage delay 820 that is present between stages of the delay chain 500. For the sake of comparison, successive transitions 814 for a delay chain having a fan-out one stage delay 824 are superimposed over the timing diagram shown in FIG. 8.

Sampling of the delay chain 500 may occur at a second time instance 808. FIG. 8 shows the progress of the wavefront through the delay chain 500 between the first time instance 804 and the second time instance 808. With an approximate one-half fan-out one stage delay 820, a signal or wavefront will propagate through the delay chain 500 at twice the speed in which a signal will propagate through a delay chain having a fan-out one stage delay, such as he delay chain 100 shown in FIG. 1. Accordingly, a greater number of stages may be present in the delay chain 500 shown in FIG. 5. In this regard, the delay chain 500 shown in FIG. 5 can achieve a greater resolution than that of the delay chain 100 shown in FIG. 1.

Initialization Circuit

The delay chain 500 shown in FIG. 5 (and the delay chains 600, 700 shown in FIG. 6 and FIG. 7, respectively) delivers a fast signal propagation with a logical complement that occurs simultaneously or substantially simultaneously. It is the case, however, that CMOS signals typically do not occur as simultaneous complements. CMOS signals typically include a single-sided signal only. Accordingly, an initialization circuit may be used to convert from the typical single-sided signal domain associated with CMOS to the simultaneous complement signal domain associated with the delay chain 500. In some prior art environments, a signal complement is created simply with the use of a single inverter. Specifically, the single-sided line is fed as an input into an inverter, the output of which produces the signal complement line. It is the case, however, that this configuration does not produce a simultaneous complement. The inverter that is used to create the complement introduces a fan-out one stage delay into the data complement line. Accordingly, the data complement signal is delayed with respect to the data signal and thus making the data and data complement signal not substantially simultaneous. As it is desirable to have simultaneous complements introduced at lines 516, 520 and present in the delay chain 500 shown in FIG. 5, a typical inverter arrangement would not be effective to initialize the delay chain. With this in mind reference is made to FIG. 9, which shows an initialization circuit 900 in accordance with implementations discussed herein.

Figure 9:
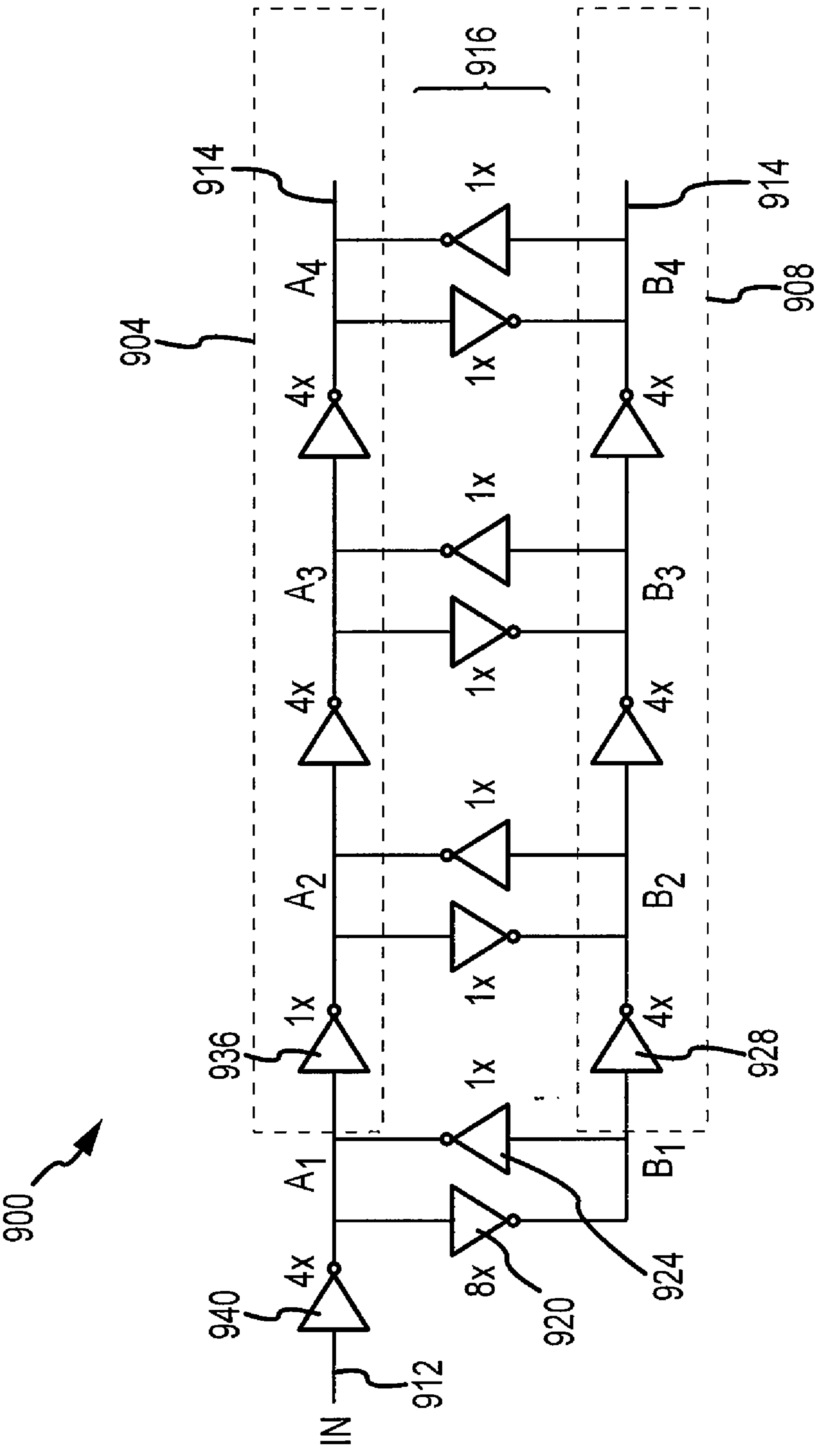
FIG. 9 is an illustration of an initialization circuit embodiment.

The initialization circuit 900 shown in FIG. 9 has a single-sided input 912 and a dual sided output 914. The circuit shown in FIG. 9 includes a data rail 904 and a data complement rail 908. The data rail 904 includes the initial input 912. The data 904 and the data complement 908 rails are inter-connected to each other through cross-coupled inverter 916 pairs. In contrast to the delay chains shown in FIG. 5 through FIG. 7, the cross-coupling in the initialization circuit 900 shown in FIG. 9 does not include a feed-forward characteristic. Specifically, the cross-coupled inverters 916 interconnect corresponding or like stages in the data 904 and data complement 908 rails. The inverters associated with the initialization circuit 900 shown in FIG. 9 are sized to counteract the delay that is normally associated with producing a data complement signal. Specifically, larger inverters (e.g. inverter 920 and inverter 928) are used in the data complement signal path 908 in order to accelerate the propagation of the data complement signal. Similarly, smaller inverters (e.g. inverter 924 and inverter 936) are used in the data signal path 904 in order to delay propagation of the data signal. In doing so, the delay between the signals is reduced and the signals are brought together to be substantially simultaneous.

Corresponding stages of the data 904 and data complement 908 rails are interconnected with cross-coupled inverter 916 pairs. The first cross-coupled inverter pair 916 includes a first inverter 920 and a second inverter 924. The first inverter 920 provides a signal path from the data rail 904 to the data complement rail 908. The second inverter 924 provides a signal path from the data complement rail 908 to the data rail 904. In one embodiment, the first transistor 920 may be between 8.1 and 7.9 times the size of the second transistor 924. In addition to this size difference, the initial transistors in the data 904 and data complement 908 rails may be sized differently. Specifically, the first inverter 928 in the data complement rail 908 may be between 4.1 and 3.9 times the size than the first inverter 936 in the data rail 904. Subsequent to the first stage of the data 904 and data complement 908 rails the transistors may be substantially the same size (subject to normal process variations).

This sizing arrangement of inverters in the initialization circuit 900 allow the signals associated with the data complement rail 908 to catch up to or align with the signals associated with the data rail 904. Accordingly, no delay associated with creating a data complement signal is introduced into the circuit. A substantially simultaneous complement signal is produced prior to the wavefront entering the delay chain. An interconnection between the initialization circuit 900 and a delay chain 500 is shown in FIG. 10.

Figure 10:
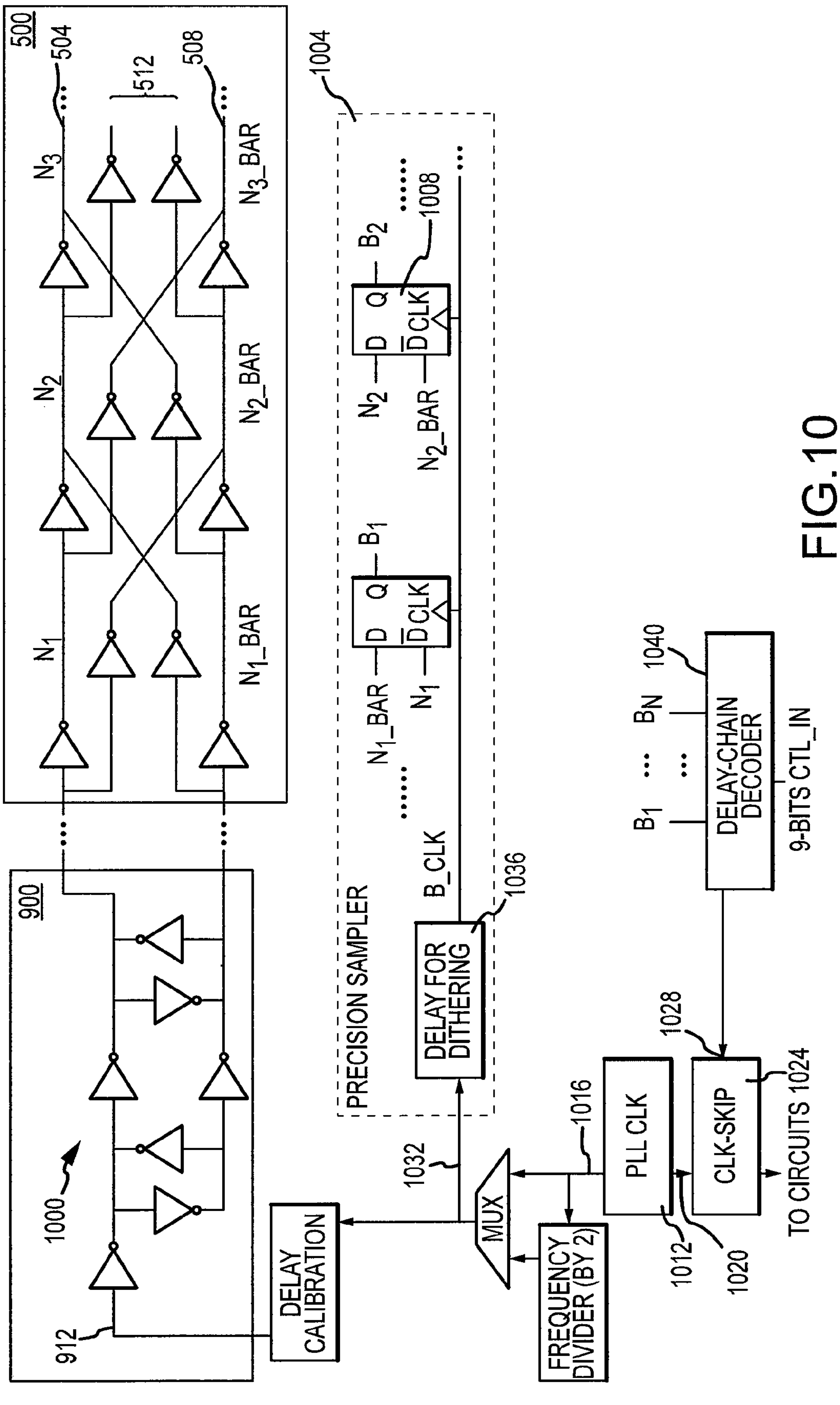
FIG. 10 is an illustration of a digital voltage regulator circuit embodiment.

In FIG. 10, a digital voltage regulator circuit in accordance with implementations discussed herein is generally identified by reference numeral 1000. The digital voltage regulator circuit 1000 includes the delay chain 500 embodiment, which is illustrated in FIG. 5. The input of the delay chain 500 is connected to the output of the initialization circuit 900, which is shown in FIG. 9. Additionally, the digital voltage regulator circuit 1000 includes a precision sampler 1004 component. The precision sampler 1004 includes a number of flip-flops 1008. Prior to a general discussion of the digital voltage regulator circuit 1000, the precision sampler 1004 will be discussed in detail.

Precision Sampler

Figure 11:
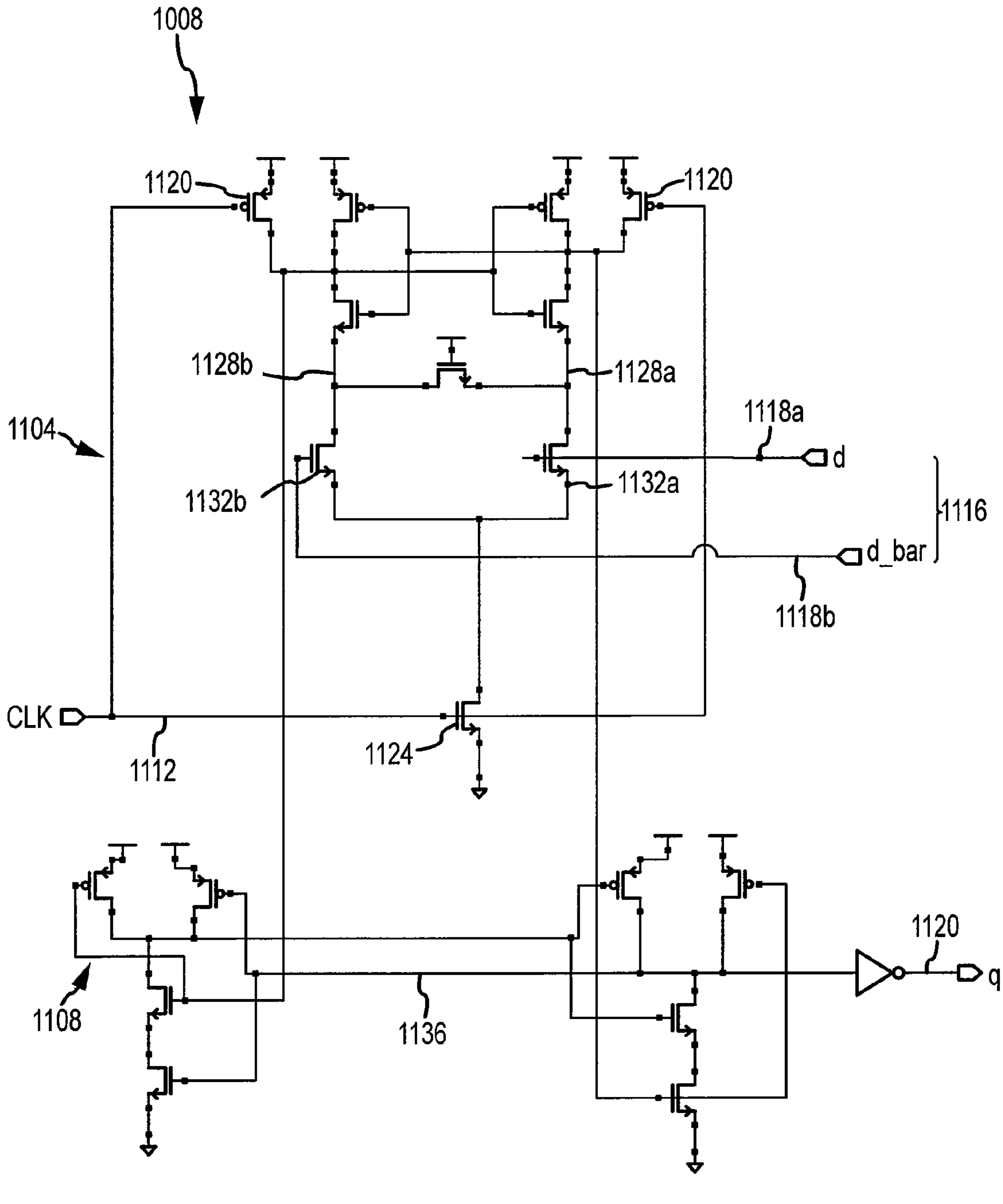
FIG. 11 is a schematic of a dual input flip-flop embodiment.

The precision sampler 1004 includes a number of dual input flip-flops 1008. As shown in FIG. 11, the flip-flop 1008 generally includes a master latch 1104 and a slave latch 1108. The master latch 1104 and the slave latch 1108 operate together to capture data present on the input 1116 during the rising edge of the clock 1112. The input includes data line 1118*a* and a data complement line 1118*b*. During the rising edge of the clock 1112, the logical value at the input 1116 is transparent through the master latch 1104 during a particular clock phase. At a clock edge, the logical value present at the input 1116 is captured by the slave latch 1108 and maintained at output 1120 during the remainder of the clock 1112 cycle.

In capturing data present at the input 1116, the master latch 1104 includes pre-charge transistors 1120 and an evaluate transistor 1124. While the clock 1112 is low, the pre-charge transistors 1120 pre-charge internal nodes 1128*a* and 1128*b* to a high voltage. Depending on the logical value present at input 1116, one of the internal nodes 1128*a* or 1128*b* will be discharged or pulled low during the evaluate phase. In this regard, the path to ground for internal nodes 1128*a* and 1128*b* includes differential pair transistors 1132*a* and 1132*b*. Transistor 1132*a* is supplied directly with the data line 1118*a*. Transistor 1132*b* is supplied directly with the data complement line 1118*b*. As transistors 1132*a* and 1132*b* are provided with opposite values, one or the other will be on. When the clock line 1112 is high, the evaluate transistor 1124 is on. During this phase, depending on which of the differential pair transistors 1132*a* and 1132*b* is on, one of the internal nodes of 1128*a* and 1128*b* will discharged. Following the discharge of one of the internal nodes 1128*a* or 1128*b*, the master latch 1104 will drive the slave latch 1108. Specifically, depending on the input at 1116, the node 1136 will be driven high or low. In this way, the logical value present at data input 1116 will be present or transparent to the node 1136 and thereby available to be captured by the slave latch 1108.

Generally, a flip-flop is a circuit element having the ability to store or remember past circuit states. Like other state elements, a flip-flop has a hysteresis characterized by two stable states. These states correspond to storing a logical ONE or a logical ZERO value. In between these two stable states, a metastable state is inevitably present. It is the extent of this metastable state or region of operation that limits the accuracy of a flip-flop as a sampler circuit as in FIG. 10. A flip-flop 1008 in accordance with implementations discussed herein is adapted to have a reduced metastability window. This reduced metastability window is due, at least in part to the internal structure of the flip-flop 1008, as illustrated in FIG. 11. Unlike conventional flip-flops, the reduced metastability flip-flop 1008 shown in FIG. 11 does not include an internally generated data complement signal. In prior art configurations, such as the flip-flop portion 200 shown in FIG. 2, a data complement signal 212 is produced by an inverter 208, which inverts the data input line 204. The inverter 208 shown in FIG. 2 is removed or is not included in the reduced metastability flip-flop 1008 shown in FIG. 11.

Instead of internally generating the data complement signal, the reduced metastability flip-flop 1008 receives the data complement 1118*b* signal as an input in combination with its corresponding data 1118*a* signal. By providing a data 1118*a* and data complement signal 1118*b* that are substantially symmetrical and substantially simultaneous as an input to the flip-flop 1008, a reduction in the flip-flop's metastability is achieved. In particular, the data 1118*a* and data complement 1118*b* lines are connected directly to the differential pair transistors 1132*a,b*. With this direct connection of the data 1118*a* and data complement 1118*b* signals, no inverter is present or is needed prior to the data complement 1118*b* signal being connected to the second differential pair transistor 1132*b*. Accordingly, there is no stage delay introduced into the data complement 1118*b* signal path. The data 1118*a* and data complement 1118*b* signals reach each of the differential pair transistors 1132*a,b* without substantial delay being introduced between the two signals. This delivery and use of substantially simultaneous complements results in a reduction in the metastability window of the flip-flop 1008, as described below.

An understanding of the metastability of a flip-flop can be appreciated by an inspection of the shape of the data and the data complement signals for the flip-flop in question. In this regard, reference is made to FIG. 12, which illustrates the signals associated with the data and data complement lines for a flip-flip having an internally generated data complement signal. In contrast, FIG. 13 illustrates the signals associated with data and data complement signals for the flip-flip 1008, shown in FIG. 11.

Figure 2:
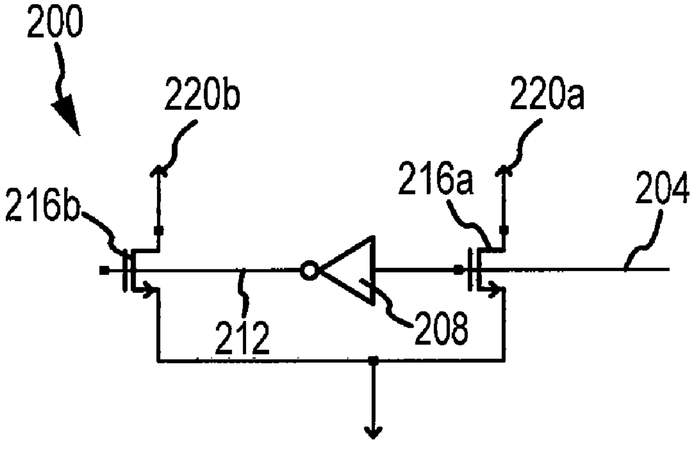
FIG.2 (PRIOR ART)
FIG. 2 is a schematic illustration of a portion of a prior art flip-flop.
Figure 12:
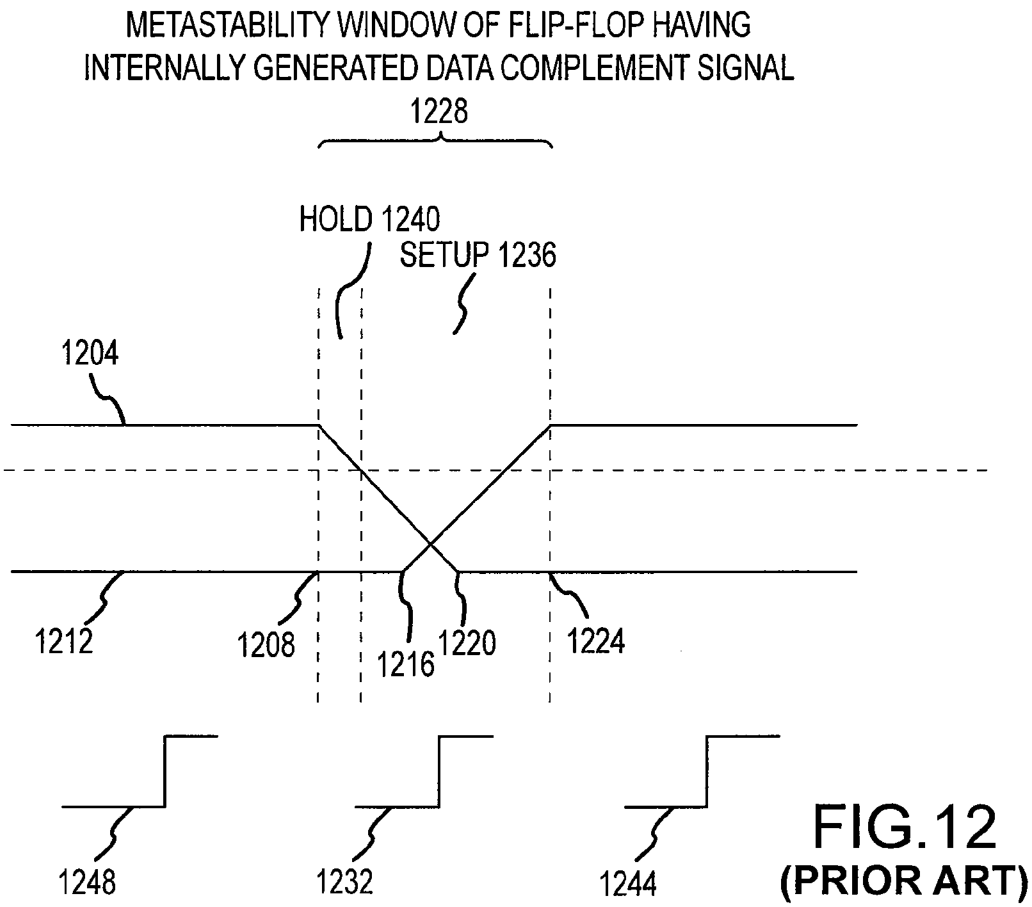
FIG.12 (PRIOR ART)
FIG. 12 is a timing diagram showing behavior of signals associated with the circuit shown in FIG. 2.

FIG. 12 illustrates a transition of a flip-flop having an internally generated data complement signal, such as would be generated by the inverter 208 shown in the flip-flop portion 200 of FIG. 2. FIG. 12 includes a data signal 1204 associated with the data line 204 and a data complement signal 1212 associated with the data bar line 212. The transition begins at a time 1208 when the data signal 1204 begins to transition from a high state to a low state. After a fan-out one stage delay associated with the inverter 208, the data complement signal 1212 begins to transition from a low state to a high state at time 1216. The data signal 1204 finishes its transition to the low state at time 1220 and the data complement 1212 signal finishes its transition to the high state at time 1224. Due to the fact that the fan-out one stage delay is present between the beginning of the transition of the data signal 1204 at 1208 and the beginning of the data complement signal 1212 transition at 1216, the amount of time in which the two signals transition to their new states is relatively extended. This period of time in which the signals are transitioning is referred to as the metastability window 1228.

If a clock edge, such as clock edge 1232, occurs during the metastability window 1228, the flip-flop may not correctly resolve to a stable state within a set period of time. In particular, the flip-flop may take an arbitrarily long time to resolve to either a logical high or a logical low state. Typically, the metastability window is divided into a setup 1236 and hold 1240 regions. The setup region 1236 refers to the period of time that the new logical value is being setup. A clock edge, such as clock 1244, must occur outside of this setup region 1236 in order to correctly resolve the new or logical low value. The hold region 1240 refers to the region during which a current logical value must be held before the occurrence of a clock edge. In particular, a clock edge such as clock edge 1248 must occur before the hold region 1240 in order to correctly evaluate the current or logical high state.

Figure 13:
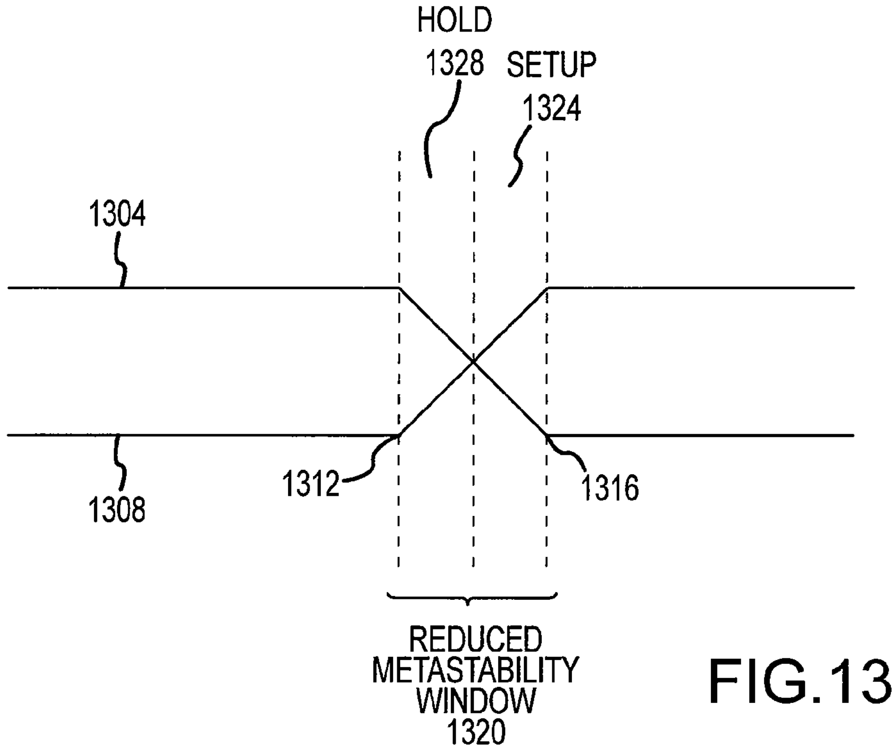
FIG. 13 is a timing diagram showing signal behavior associated with a flip-flop shown in FIG. 11.

FIG. 13 is a timing diagram showing the behavior of a data signal 1304 associated with the data line 1118*a* and a data complement signal 1308 associated the data complement line 1118*b* for the flip-flop 1008. The timing diagram shown in FIG. 13 illustrates a transition from a logical high to a logical low state. The data line 1118*a* and data complement line 1118*b* are provided with signals that substantially symmetrical and substantially simultaneous and this signal characteristic is preserved at the input to the differential pair transistors 1132*a* and 1132*b*. The transition begins at time 1312 when the data signal 1304 begins to transition from the high state to the low state. The data complement signal 1308 provides a substantially simultaneous complement signal with respect to the data signal 1304. The data complement signal 1308 begins its transition from a logical low state to a logical high state at time 1312. This is in contrast to the behavior of prior art flip-flops shown in FIG. 12, wherein a fan-out one stage delay is present between the beginning of the transition of the data signal 1208 and the beginning of the transition of the data complement signal 1216. In addition to being substantially simultaneous, the signals at the input to the differential pair transistors 1132*a* and 1132*b* are substantially symmetrical. In FIG. 13, the data signal 1304 finishes its transition to the low state at time 1316. Concurrently, the data complement 1308 signal finishes its transition from the logical low state to the logical high state at time 1316. Due to the lack of a fan-out one stage delay between the beginning of the transition of the data signal 1304 and the beginning of the transition of the data complement signal 1308 and due to these signals having substantially symmetrical and simultaneous characteristic, these signals finish their complete transition earlier than the signals associated with the prior art flip-flops. Due to this faster signal transition, the flip-flop 1008 has a reduced metastability window 1320, as shown in FIG. 13. It is also noted that the metastability window 1320 includes balanced set-up 1324 and hold 1328 regions. In particular, the hold region 1328 of the metastability window 1320 is substantially the same size as the set up region 1324.

Figure 14:
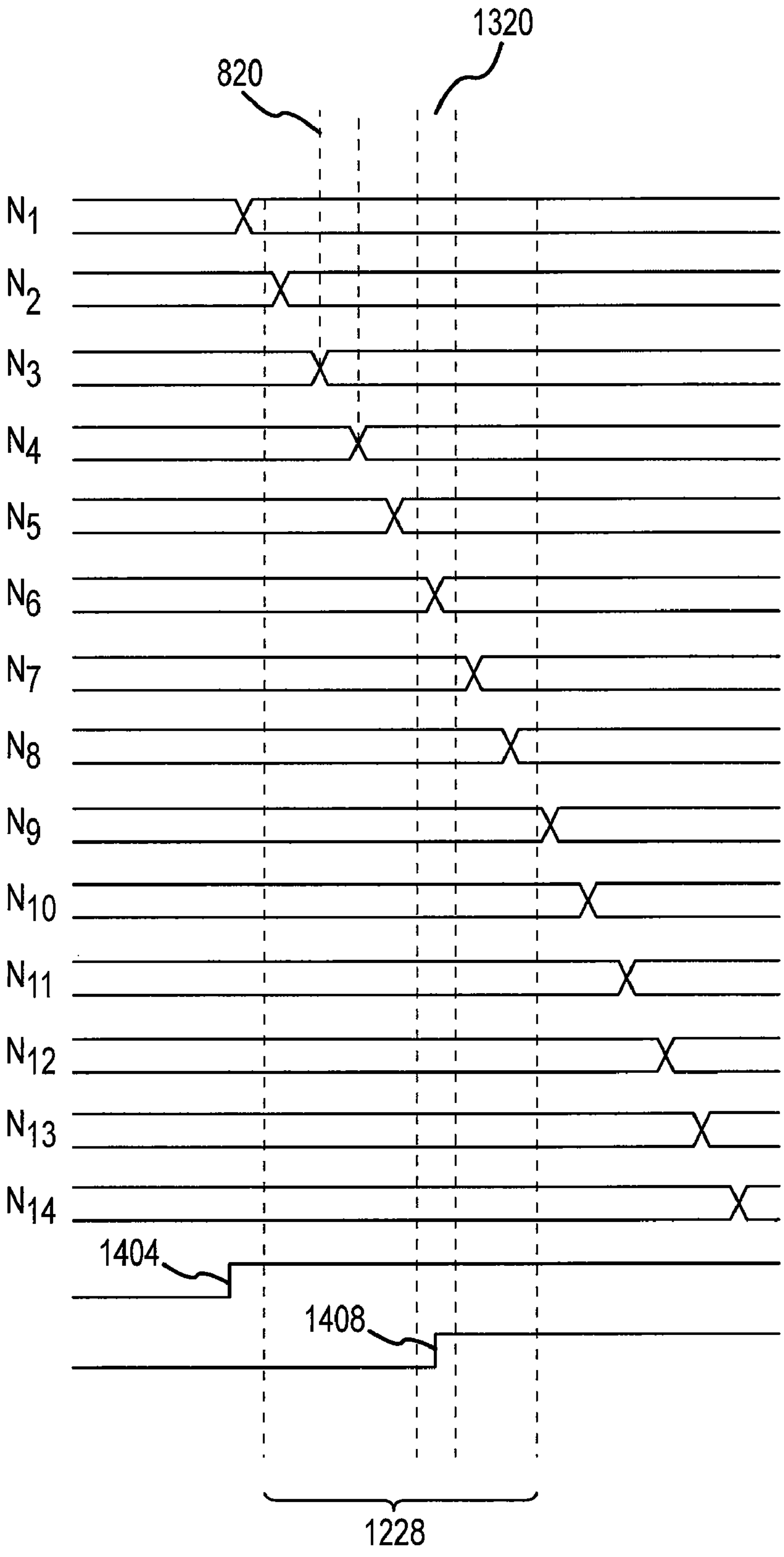
FIG. 14 is a timing diagram showing the progress of a wavefront down the delay chain embodiment shown in FIG. 5 and including a metastability window centered around a clock edge.

The reduced metastability window 1320 of the flip-flop 1008 enhances the ability of the flip-flop 1008 to sample or resolve values present on a delay chain, such as the delay chain 500. The metastability window of the flip-flop 1008 typically spans fewer stage delays than is possible with prior art flip-flop designs. This behavior is illustrated in FIG. 14. FIG. 14 is a timing diagram showing the inputs received at each flip-flop 1008 associated with the precision sampler 1004. Referring to FIG. 11, the input to each flip-flop 1008 is dual ended and includes a data line 1118*a* and a data complement 1118*b* line. At an initial time instance 1404, a wavefront is initiated in the delay chain 500. Subsequent to this first time instance 1404, the wave propagates down the delay chain 500 beginning with a first transition, which occurs in the first delay chain 500 stage. The delay chain 500 may be sampled at a subsequent or second time instance 1408 to determine the progress of the wavefront down the delay chain 500. This second time instance 1408 is represented in FIG. 14 as a rising clock edge. It should be appreciated that time instances are shown as rising clock edges by way of illustration and not limitation. In other embodiments, failing clock edges may be used.

FIG. 14 shows a metastability window 1320, which is centered on the rising clock edge 1408. It is found that the metastability of the flip-flop 1008 is less than one stage delay associated with the timing chain 500. This can be seen with reference to FIG. 14 wherein the sub-fan-out one stage delay 820 between the third and fourth stages is indicated. With the metastability window 1320 of the flip-flop 1008 being less than one stage delay associated with the timing chain 500, at most one stage transition may occur during the metastability window 1320. In FIG. 14, the transition of signal N6 falls within the metastability window 1320 associated with the clock edge 1408. Here, the maximum number of stage transitions fall within the metastability window 1320. It should be appreciated however that it is possible for no stage transitions to fall within the metastability window. In particular, a clock edge may occur subsequent to one stage transition and prior to the next stage transition. Referring again to FIG. 14, the remainder of the transitions occur outside of the metastability window 1320. In particular, transitions of signals N1 through N5 occur before the metastability window 1320 and transitions of signals N7 and above occur after the metastability window 1320.

For the sake of comparison, a metastability window 1228 for a flip flop having an internally generated data complement signal is superimposed over the timing diagram shown in FIG. 14. Like the reduced metastability window 1312, the metastability window 1228 for a flip flop having an internally generated data complement signal is shown with respect to the clock edge 1408. As can be seen, the metastability window 1228 for a flip flop having an internally generated data complement signal spans several delay chain stage transitions. Accordingly, a greater number such flip-flops will go metastable if used in connection with measuring a delay chain value.

The ability of the precision sampler 1004 to operate with at most one flip-flop 1008 going metastable leads to an improved performance of the digital voltage regulator 1000. In particular, the digital voltage regulator 1000 includes a minimal bubble characteristic as can be appreciated from a general discussion following.

Minimal Bubble Voltage Regulator

Referring again to FIG. 10, the operation of the digital voltage regulator 1000 will now be discussed in detail. The digital voltage regulator 1000 may be deployed as a component of an integrated circuit. An integrated circuit includes other components in addition to the digital voltage regulator 1000 such as digital logic circuits, on chip memory, etc. The operation of components within an integrated circuit may be coordinated by means of a system clock. Typically, a clock signal is distributed throughout the integrated circuit and is initially generated by means of a phase lock loop (PLL) clock 1012, as shown in FIG. 10. The phase lock loop clock 1012 is provided to the digital voltage regulator 1000 through output line 1016. In addition to this output line, the PLL clock 1012 includes output line 1020 that provides the phase lock loop clock 1012 to the remainder of the integrated circuit. Prior to being distributed to the remainder of the integrated circuit, the PLL clock output 1020 may pass through a clock skip circuit 1024. The clock skip circuit 1024 includes an enable 1028 which is connected to an output of the delay chain decoder 1040. When this output from the delay chain decoder 1040 is asserted the clock skip circuit 1024 prevents or blocks the PLL clock 1012 from passing through the clock skip circuit 1024 to the remainder of the integrated circuit. This operation is taken or this line is asserted when it is determined by the delay chain decoder 1040 that the power supply voltage has fallen below a predetermined threshold amount. By disabling the PLL clock 1012 or otherwise preventing it from being passed to the remainder of the integrated circuit the low voltage condition in the power supply is thereby mitigated. With no clock signal arriving in the remainder of the integrated circuit, the chip is effectively disabled for at least one clock cycle. Without the clock signal, the logic circuits or other components do not switch and thus do not draw additional current from the power supply. In this way, disabling the system clock allows the power supply voltage to rise to an acceptable operating level.

In determining the power supply voltage by the voltage regulator circuit 1000, the PLL clock 1012 or a multiple thereof is received at the initialization circuit 900 at input 912 and at the precision delay sampler 1004 at input 1032. The precision delay sampler 1004 includes a delay circuit 1036. The delay circuit 1036 is operable to delay the clocking of the flip-flops 1008 associated with the precision sampler 1004 to a time subsequent to the initiation of a wavefront in delay chain 500. Specifically, the PLL clock 1012 signal arrives at the input 912 to the initialization circuit 900 at a first time instance. The delay circuit 1036 causes the PLL clock 1012 to arrive at a subsequent second instance at the clock inputs to the flip-flops 1008. The delay circuit 1036 may be calibrated such that the second time instance occurs when the wavefront, which was initiated at the first time instance, is at an intermediate point in the delay circuit 500.

As shown in FIG. 10, each stage of the delay chain 500 includes a data 504 and data complement 508 delay rail. At each stage of the delay chain 500, the data 504 and data complement 508 rails are connected to the data 1118*a* and data complement 1118*b* inputs of a corresponding flip-flop 1008 in the precision sampler 1004. It should be appreciated that a wavefront propagating through the delay chain 500 will produce an alternating series of high and low stages in each stage of the delay chain 500. Accordingly, the odd numbered stages (N1, N3, N5 etc.) may be interpreted in one sense. Specifically, a logical high on these lines may indicate a logical ONE. Similarly, the even numbered circuit stages (specifically N2, N4, N6 etc.) may be interpreted in an opposite manner. Specifically, a logic low on these lines may be interpreted as a logical ONE. This interpretation of the delay chain 500 is reflected in the inputs to the flip-flops 1008 associated with the precision sampler 1004. The odd numbered flip-flops 1008, those associated with stages N1, N3, N5 etc. may be "cross-wired." Specifically, the data delay rail 504 is connected to the data complement 1118*b* input of the corresponding flip-flop 1008. Similarly, the data complement rail 508 is connected to the data input 1118*a* of the corresponding flip-flop 1008. In contrast, the even numbered stages, those associated with stages N2, N4, N6 etc., are not "cross-wired." Specifically, the data delay rail 504 is connected to the data input 1116 and the data complement rail 508 is connected to the data complement 1118*b* input at the corresponding flip-flop 1008. In this way, the precision sampler 1004 will interpret the delay chain 500 in a consistent manner.

Figure 15:
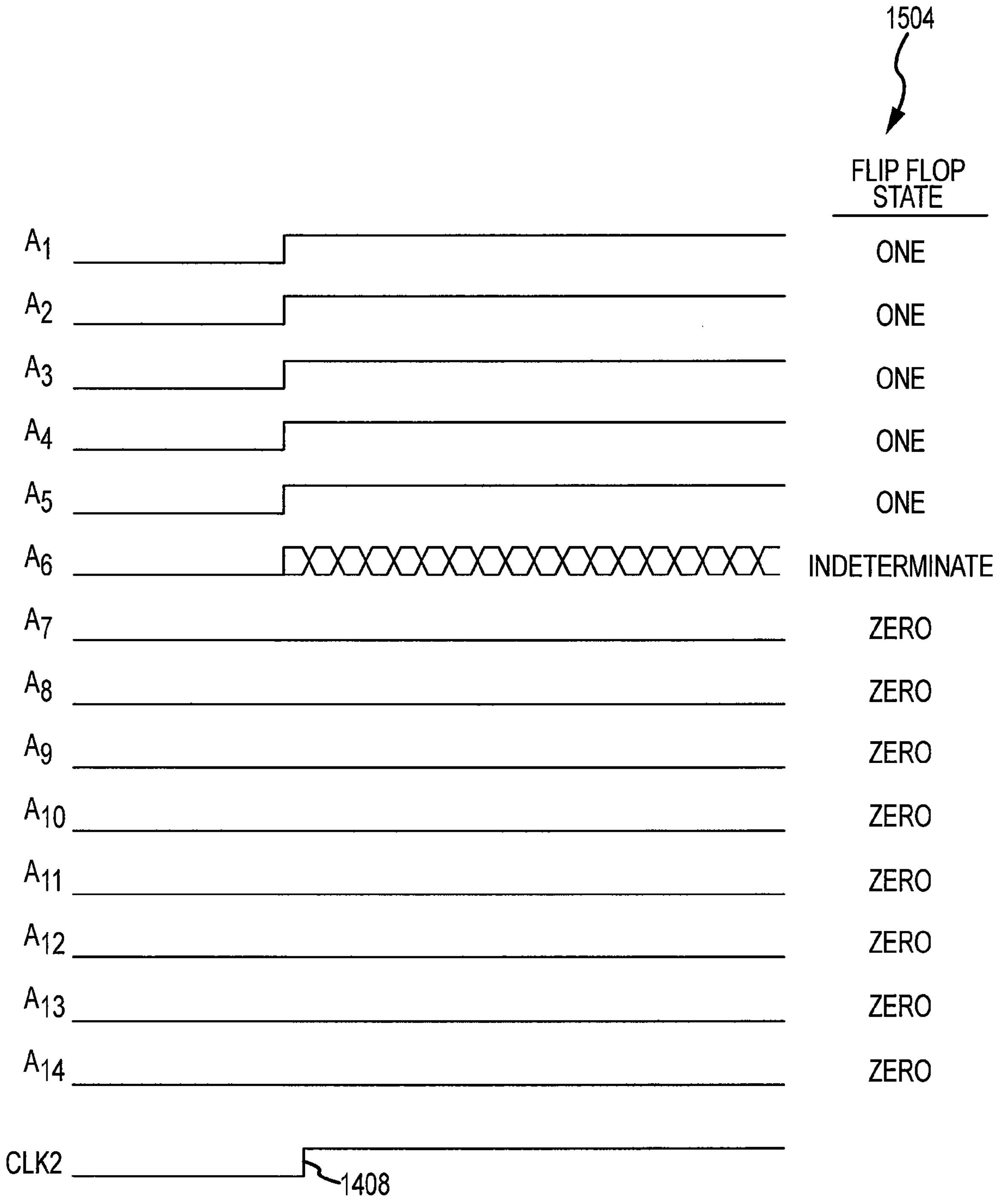
FIG. 15 is a logic diagram showing the outputs of a precision sampler shown in FIG. 10.

The voltage regulator circuit 1000 achieves high levels of precision due to a number of factors. Firstly, the delay chain 500 has a high resolution. Specifically, the delay chain 500 includes dual delay chain rails 504, 508 interconnected by relatively large feed-forward cross-coupled inverter pairs 512. This orientation produces a sub fan-out one stage delay between stages of the delay chain 500. Accordingly, a greater number of stages can be present in the delay chain 500 than is possible in prior art delay chains. Specifically, each bit in the captured delay chain value corresponds to a binary value read from a particular delay chain stage. As the circuit configurations discussed herein allow a wavefront to propagate through a greater number of delay chain stages in a given time interval (clock cycle), a greater number of stages may be included in the delay chain. This aspect of the delay chain 500 allows for a greater number of significant bits in the captured scan chain value that is read by the precision sampler 1004. In configurations that produce an approximate one-half fan-out one stage delay, an approximate two-fold increase in the resolution of delay chain measurements may be achieved. In addition to the high resolution of the delay chain 500, increased levels of precision may be achieved by the precision sampler 1004 employing reduced metastability flip-flops 1008. The flip-flops 1008 are provided with substantially simultaneous and symmetrical data 1118*a* and data complement 1118*b* lines and do not include an internal inverter, which in prior art configurations would internally produce the data complement 1118*b* signal. Due to these characteristics, the flip-flops 1008 generally have a reduced metastability window. As shown in FIG. 15, the metastability window of the flip-flop 1008 spans at most one stage delay of the delay chain 500.

These characteristics of the digital voltage regulator 1000 shown in FIG. 10 provide for a minimal bubble, voltage-to-time conversion. This is demonstrated by FIG. 15, which shows a timing diagram for the output of the precision sampler 1004. FIG. 15 is a timing diagram that shows the signal behavior for each output line of flip-flops 1008, when triggered at the second time 1408. FIG. 15 additionally includes column 1504 that indicates the state of each bit at time instance 1408. The output lines A1-A5 and A7 and above correctly resolve to a stable state or logic value. The outputs A1-A5 correctly evaluate the logical ONE state, which is present in the corresponding delay chain 500 stages. Output lines A7 and above correctly resolve to a ZERO logical state corresponding to the state of the corresponding delay chain 500 stages. Output A6 only does not resolve to a stable state in a predetermined amount of time. FIG. 15 illustrates an instance in which a signal transition falls within the metastability window 1320. It should be appreciated, however, that it may be the case that the clock edge or second time instance 1408 occurs between transitions of the delay chain 500 stages. Accordingly, in this instance no indeterminate output would occur. Once the flip-flops 1008 are triggered and the delay chain 500 values are captured as shown in FIG. 15, the captured value is available to be provided to the delay chain decoder 1040 for use in determining whether or not the voltage has fallen below a predetermined threshold.

Figure 16:
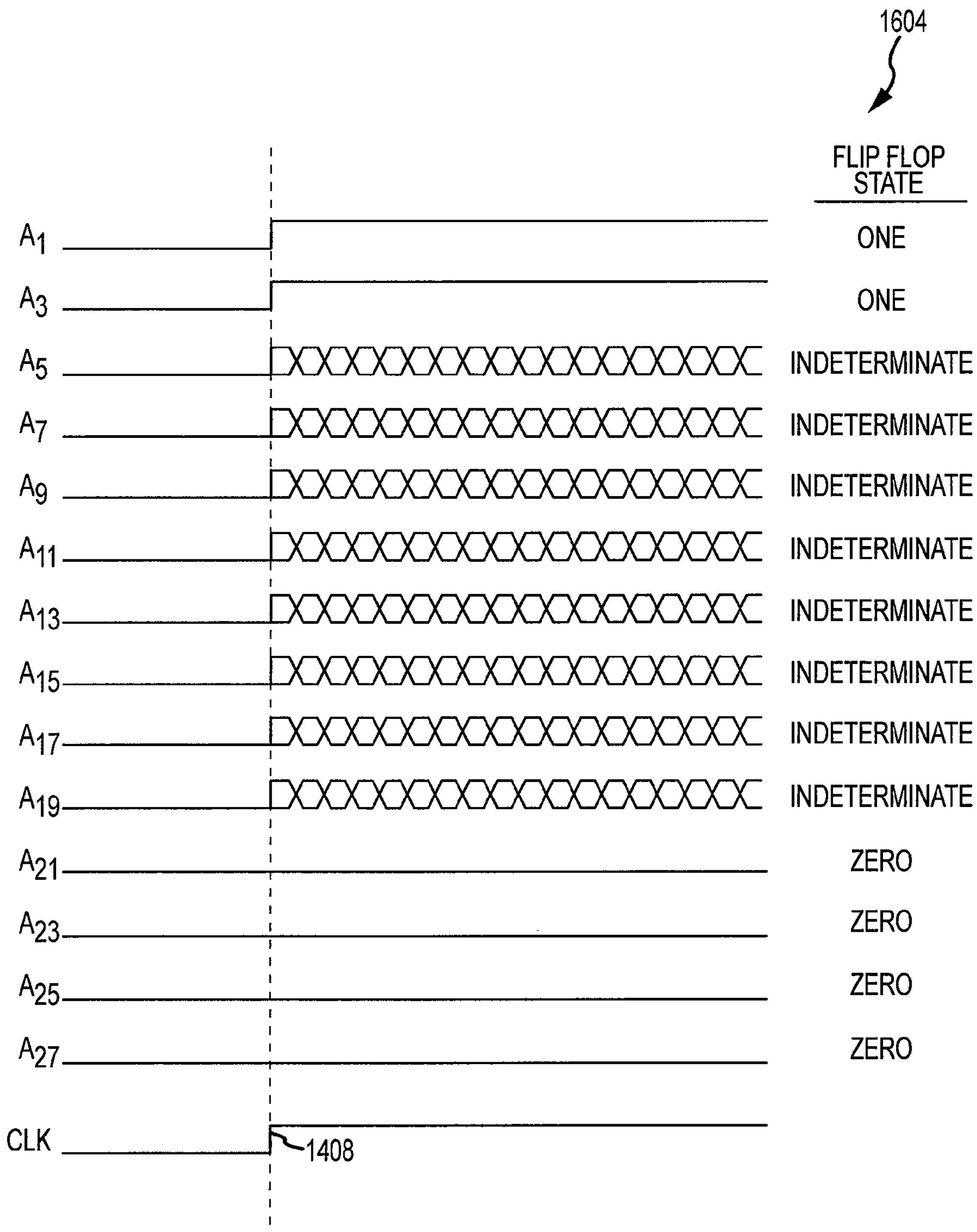
FIG. 16 is a timing diagram showing behavior signals associated with a prior art voltage-to-time conversion.

For the sake of comparison, FIG. 16 shows the outputs of flip-flops which sample a delay chain with a metastability window 1228, as shown in FIG. 14. The value of each bit at the second time instance 408 is shown in column 1604. As shown in FIG. 6, bits A1 through A3 are correctly resolved as a logical ONE. Bits A21 and higher correctly resolve as a logical ZERO. Bits A5 through A19, however, do not arrive at a definite state within a predicable time and are therefore indeterminate. This indeterminate region is referred to as the "bubble" of the sampling circuit. The bubble occurs around the clock edge 1408. With a bubble present such as the one illustrated in FIG. 16, the ability to accurately determine the voltage of the power supply is adversely affected. In particular, only rough estimates can be made based on the logical value read from the delay chain.

Figure 17:
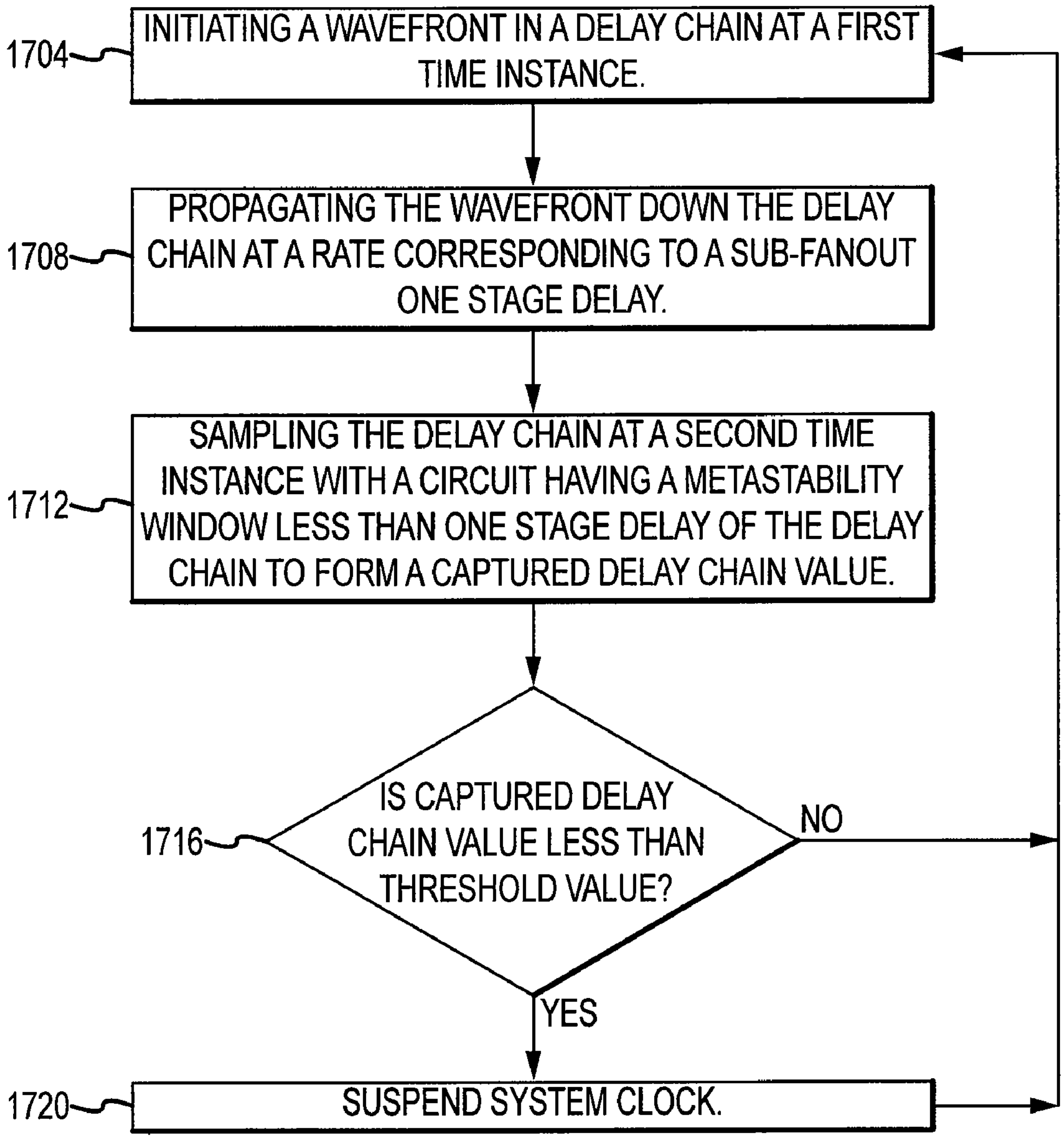
FIG. 17 is a flow chart illustrating operations in a method of regulating voltage in accordance with implementations discussed herein.

FIG. 17 is a flow chart illustrating a method in accordance with implementations discussed herein. Specifically, the flow chart shown in FIG. 17 illustrates the operation of a digital voltage regulator, such as the digital voltage regulator 1000 shown in FIG. 10. The flow chart shown in FIG. 17 illustrates a method of regulating voltage in an integrated circuit. Initially, at operation 1704, a wavefront is initiated in a delay chain 500 at a first time instance. The wavefront may be initiated by the operation of a PLL clock 1012. Initializing the wavefront in the delay chain 500 may be accomplished by the initialization circuit 900. The initialization circuit 900 operates to convert a single ended input into a dual ended output that is fed into the delay chain 500. Following operation 1704, operation 1708 may be executed.

At operation 1708, the wavefront propagates down the delay chain 500. The signals propagate down both rails 504, 508 of the dual rail delay chain 500 at a speed corresponding to the sub fan-out one stage delay associated with the delay chain 500. After operation 1708, operation 1712 may be executed.

At operation 1712, the delay chain 500 is sampled at a second time instance by a precision sampler 1004. The delay chain 500 may be sampled using a plurality of flip-flops 1008 that have a metastability window 1320 less than one stage delay of the delay chain 500. In sampling the delay chain 500, a captured delay chain value is thereby formed or captured in the precision sampler 1004. After operation 1712, operation 1716 may be executed.

At operation 1716 a determination is made based on the captured delay chain value if the voltage of the power supply has fallen below a predetermined threshold. If in fact the power supply voltage has fallen below the threshold value, the system clock may be suspended, at operation 1720. Here, a clock skip circuit 1024 may be enabled to prevent the PLL clock 1012 from being provided to the remainder of the integrated circuit. In one embodiment, the system clock remains suspended for a single clock cycle after which progress of a wavefront down a delay chain is again measured to determine if the voltage has risen above the threshold value. Accordingly, operation 1704 may follow operation 1716. If, at operation 1716, it is determined that the power supply voltage is not less than the threshold voltage, no action need be taken. However, operation 1704 may follow operation 1716 in order to sample the delay chain 500 during the next clock cycle.

Figure 18:
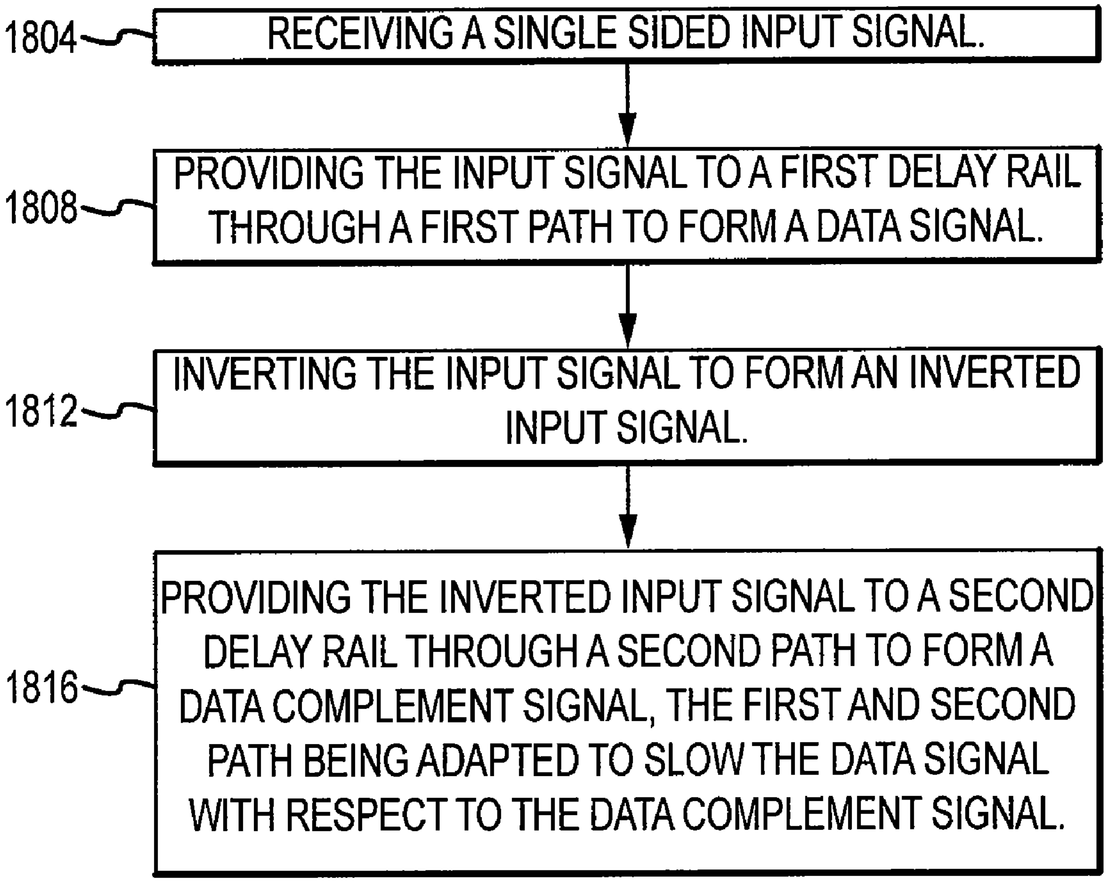
FIG. 18 is a flow chart illustrating operations in a method of initializing a wavefront in a delay chain in accordance with implements discussed herein.

FIG. 18 is a flow chart showing operations in a method of initializing a wavefront in a delay chain 500. The method illustrated in FIG. 18 can be considered an elaboration of operation 1704 shown in FIG. 17. Initially, at operation 1804, a single-sided signal is received as an input. With reference to the circuit shown in FIG. 9, the input signal is received at the input line 912. Following operation 1804, operation 1808 may be executed.

At operation 1808, the input signal is provided to a data rail 904 through a first path to form a data signal. Specifically, the input signal passes through the inverter 940 to node A1. Node A1 corresponds to the first stage in the data rail 904. The signal that propagates through the data rail 904 corresponds to the data signal. Following operation 1808, operation 1812 may be executed. At operation 1812, the input signal is inverted to form an inverted input signal. Specifically, the inverter 920 inverts the signal present in the data rail 904 at the node A1. Following operation 1812, operation 1816 may follow.

Operation 1816 includes providing the inverted input signal to the data complement rail 908, as shown in FIG. 9. This may include connecting the output of the inverter 920 to the beginning of the data complement rail 908. The signal which propagates through this data complement rail 908 corresponds to an opposite or complement signal of the data signal present in the data rail 904. In accordance with the implementations discussed herein, the signal paths taken in the data 904 and data complement 908 rails are adapted to delay the progress or speed of the data signal with respect to the data complement signal. In particular, the inverter 920 is eight times the size of the inverter 936. Additionally, the first inverter 928 in the data complement rail 908 is approximately four times the size of the first inverter 936 in the data rail 904. The increased or larger size transistors in the data complement signal path allow the signal to travel at a faster rate initially than the data signal. Accordingly, the larger size of the inverters in the data complement signal path compensate for the fact that a fewer number of inverters exist in the data signal path. This allows the data complement signal to match phases with the data signal, such that the data and data complement are substantially simultaneous. Accordingly, when the wavefront passes through the initialization circuit 900 the data and data complement signals are substantially simultaneous.

Figure 19:
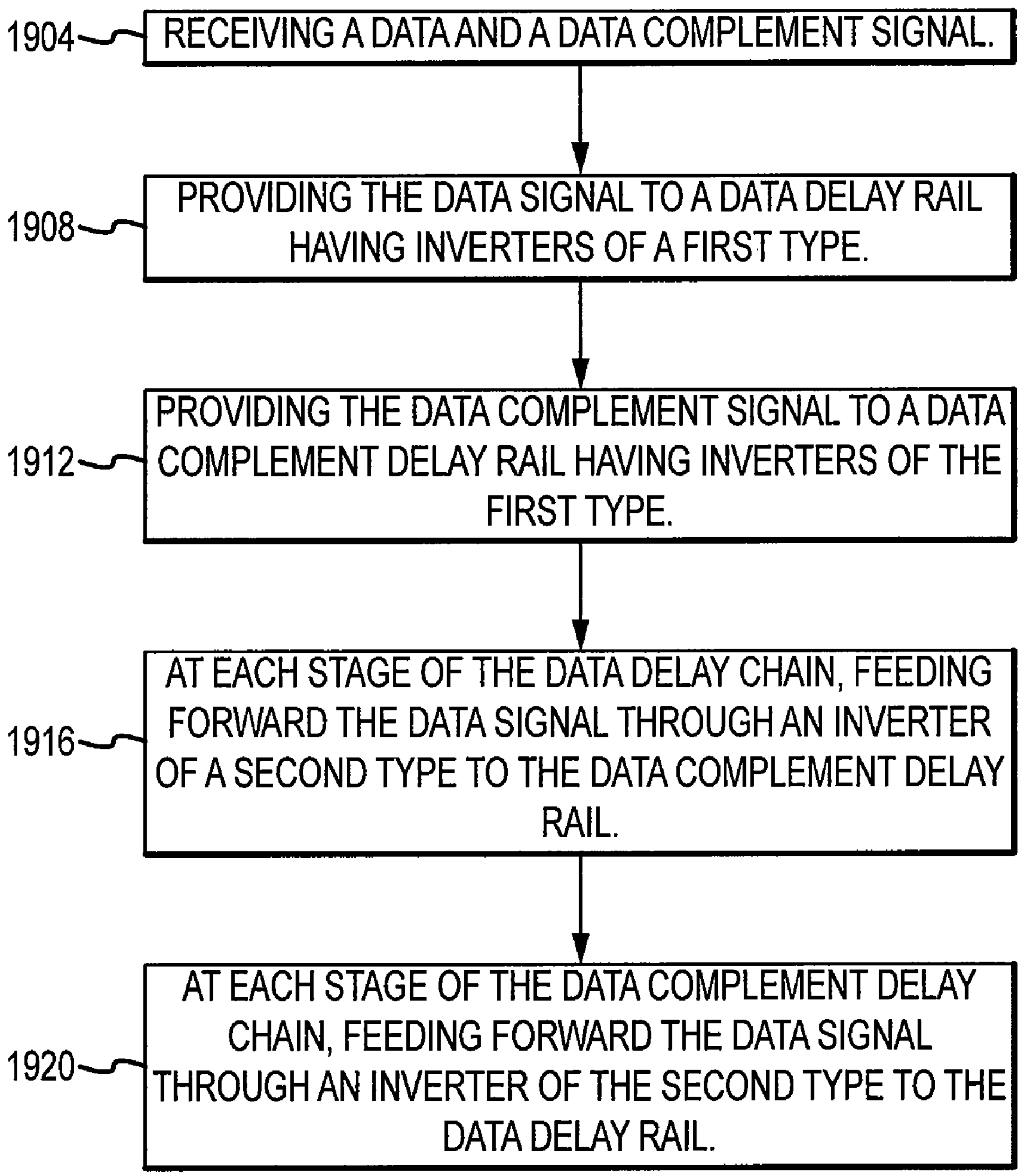
FIG. 19 is a flow chart showing operations in a method of propagating a signal in a delay chain in accordance with implementations discussed herein.

FIG. 19 is a flow chart illustrating a method of propagating a wavefront in a delay chain. The method illustrated in FIG. 19 may be considered an elaboration of operation 1708 shown in FIG. 17. Initially, at operation 1904, a data and a data complement signal are received. The data and data complement signal may be received from an initialization circuit 900 such as the one shown in FIG. 9, thus providing a data and data complement signal which are substantially simultaneous. With reference to the delay chain circuit shown in FIG. 5, the data signal is received at input 516 and the data complement is received at input 520. (For illustrative purposes the method illustrated in FIG. 19 will be discussed in connection with the delay chain 500. However, it should be appreciated that other delay chains such as those shown in FIG. 6 and FIG. 7 may be used in connection with the method shown in FIG. 19.)

At operation 1908, the data signal is provided to a data delay rail 504. Specifically, the data signal passes through the first inverter in the data delay rail 504. Operation 1908 may occur concurrently with operation 1912. In operation 1912, the data complement signal is provided to the data complement delay rail 508. Specifically, the data complement signal is passed through the first inverter in the data complement delay rail 508. Here, it is noted that the inverters associated with the data delay rail 504 and the data complement delay rail 508 are all of the same size. Moreover the data delay rail 504 and the data complement delay rail 508 are interconnected by cross-coupled inverter pairs 512 which are of an increased size with respect to the rail inverters 506. Following operation 1912, operation 1916 may be executed.

At operation 1916, cross-coupled 512 inverters are used to feed forward the data signal to a stage in the data complement delay rail 508. Similarly, the cross-coupled inverters 512 are used in operation 1920 to feed forward the data complement signal to a stage in the data delay rail 504. In connection with the circuits shown in FIG. 5, the cross-coupled inverters 512 feed forward their respective signals by two stages in the delay chain 500. However, it should be appreciated that other feed forward operations such as feed-forward-four or feed-forward-eight may be implemented. In subsequent delay chain 500 stages, signal propagation may continue as illustrated in FIG. 19.

Figure 20:
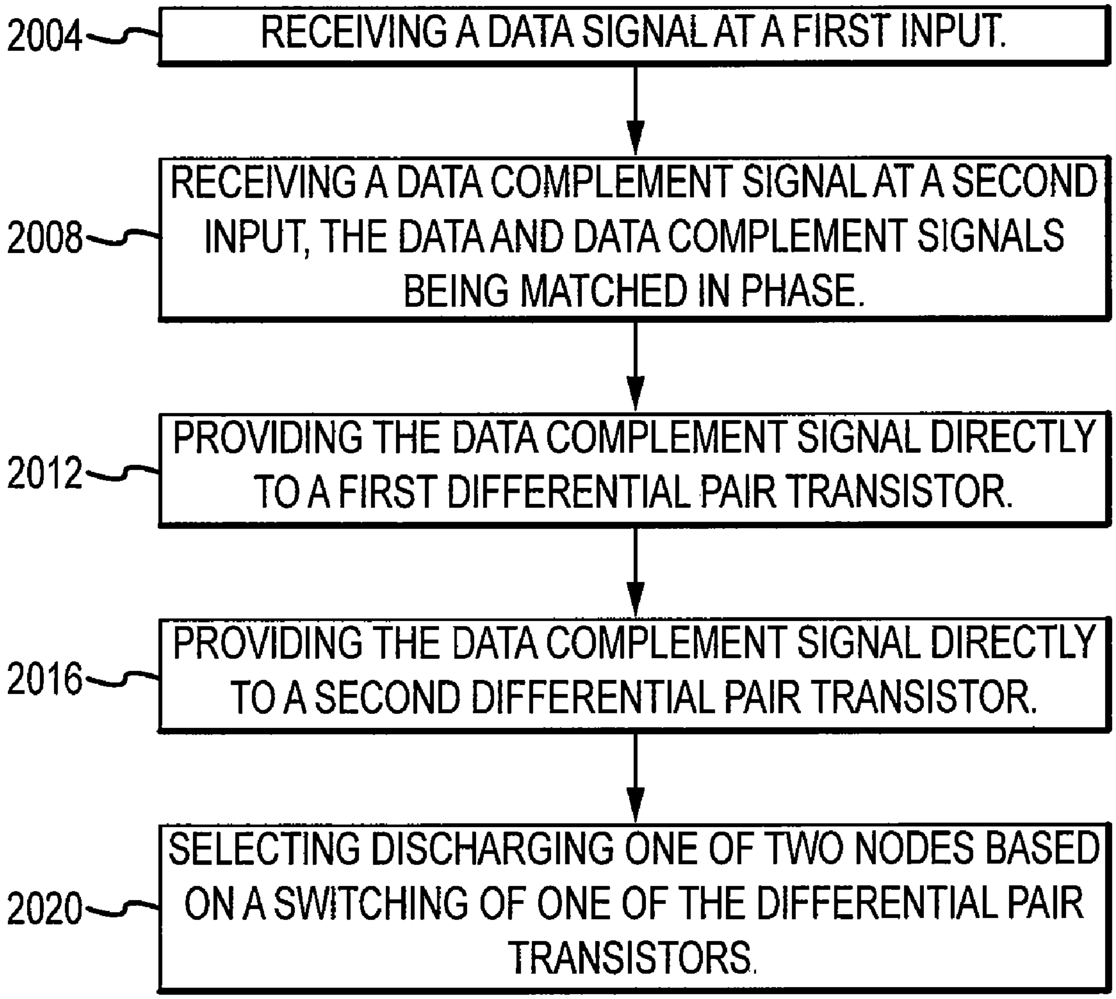
FIG. 20 is a flow chart illustrating operations in a method of sampling a delay chain or other inputs in accordance with implementations discussed herein.

FIG. 20 is a flow chart illustrating a method of sampling a delay chain or other input signal in accordance with implementations discussed herein. The method illustrated in FIG. 20 may be considered as an elaboration of operation 1712 shown in FIG. 17. The method illustrated in FIG. 20 will be discussed in connection or with reference to the flip-flop 1008 shown in FIG. 11. Initially, at operation 2004, a data signal (such as from delay rail 504) is received at a first input 1118*a*. Concurrently, at operation 2008, a data complement signal (such as from data complement rail 508) is received at a second input 1118*b*. Here it is noted that the data signal and the data complement signal are substantially symmetrical and substantially simultaneous when they arrive at the flip-flop 1008. Following operation 2008, operation 2012 may be executed.

In operation 2012, the data signal is provided directly to a first differential pair transistor 1132*a*. Concurrently with operation 2008, in operation 2016 the data complement signal is provided directly to a second differential pair transistor 1132*b*. Here it is noted that neither the data signal nor the data complement signal pass through an intermediate circuit element such as an inverter. This intermediate element typically is needed in prior art configurations which do not provide a substantially simultaneous complement data input signal. Following operation 2012 and 2016, operation 2020 may be executed.

At operation 2020 one of two precharged nodes 1128*a,b* is selectably discharged based on the inputs present at the differential pair transistors 1132*a,b*. Specifically one of the two differential pair transistors 1132*a,b* is enabled to provide a path to ground on the rising clock edge thereby discharging one of the two precharge nodes 1128*a,b*. By receiving a data 1118*a* and data complement 1118*b* signal which are substantially simultaneous at the input to the flip-flop 1008 and by directly connecting the data 1118*a* and data complement 1118*b* signals to the differential pair transistors 1132*a,b*. The flip-flop 1108 achieves a reduced metastability window and thereby an enhanced performance.

The foregoing merely illustrates certain principles of aspects of the invention with reference to circuit implementations that conform to inventive concepts. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. For example, while various embodiments have been described and illustrated with reference to active high signals, it should be understood that active low signals may also be used. From the above description and drawings, it will be understood by those of ordinary skill in the art that the particular embodiments shown and described are for purposes of illustration only and are not intended to limit the scope of the present invention. References to details of particular embodiments are not intended to limit the scope of the invention.

What is claimed is:

1. A digital voltage regulator component of an integrated circuit, the integrated circuit having a power supply and logic circuits, the digital voltage regulator comprising:

a delay chain having a data delay rail and a data complement delay rail, the data and data complement delay rails being interconnected through pairs of cross-coupled inverters, wherein the delay chain includes a plurality of stages;

a sampling circuit having a plurality of differential input flip-flops each connected to a corresponding stage of the delay chain to capture a corresponding delay chain value, wherein each differential input is connected to a data output and data complement output associated with the corresponding stage of the delay chain to capture the corresponding delay chain value, and wherein each differential input flip-flop includes first and second pre-charge nodes, the first pre-charge node connected to a first transistor, the second pre-charge node connected to a second transistor, wherein a data input line is connected directly to the first transistor and a data complement line is connected directly to the second transistor; and a decoder circuit having a plurality of inputs, each input connected to an output of a corresponding differential input flip-flop in the sampling circuit to receive the corresponding delay chain value, wherein the decoder circuit is operable to calculate a power supply voltage based on the plurality of inputs, the decoder circuit including an output that when asserted indicates that a power supply voltage has fallen below a predetermined threshold value.

2. The digital voltage regulator of claim 1, wherein each pair of cross-coupled inverters includes an input connected to a first stage of the delay circuit and an output connected to a second stage of the delay circuit, the second stage being two stages ahead of the first stage.

3. The digital voltage regulator of claim 1, wherein the cross-coupled inverters are at least ten times the size of inverters in the data delay rail and inverters in the data complement delay rail.

4. The digital voltage regulator of claim 1, wherein each stage of the delay chain has a sub fan-out one stage delay.

5. The digital voltage regulator of claim 1, wherein the delay chain includes an initialization circuit having a single-sided input and a differential output, the differential output connected to the data delay rail and the data complement delay rail, the differential output providing a data signal and a data complement signal that are substantially simultaneous.

6. The digital voltage regulator of claim 1, further comprising:

a delay chain input operable to receive a clock pulse, the clock pulse creating a wavefront that propagates through the delay chain, wherein a rate at which the wavefront propagates through the delay chain is dependent on the power supply voltage.

7. The digital voltage regulator of claim 1, wherein the output of the decoder circuit is connected to a clock skip circuit, the clock skip circuit being operable to disconnect a system clock from the logic circuits of the integrated circuit when the output of the decoder circuit indicates that the power supply voltage is below the predetermined threshold.

8. The digital voltage regulator of claim 1, wherein a metastability window of each differential input flip-flop is less than a delay through a stage of the delay chain.

9. A method of regulating voltage in an integrated circuit, comprising:

propagating a data signal wavefront in a multistage delay chain at a rate having a wavefront delay that is less than a fan-out one delay for transistors associated with the stages of the delay chain, the delay chain having a data delay rail and a data complement delay rail which are cross-coupled;

sampling a data output and data complement output of corresponding stages of the data delay rail and the data complement delay rail with a sampling circuit having a metastability window that is less than the wave front delay to form a sampled data value;

comparing the sampled data value to a data value indicative of a threshold voltage at a decoder circuit to determine if a power supply voltage is below the threshold voltage; and in response to determining that the power supply voltage is below the threshold voltage, reducing a power supply load, wherein reducing the power supply load includes disconnecting a system clock for at least one clock cycle.

10. The method of claim 9, wherein propagating a data signal wavefront includes initiating the data signal wavefront in the delay chain.

11. The method of regulating voltage of claim 10, wherein propagating the data signal wavefront through the delay chain includes feeding a signal forward two stages from the data delay rail to the data complement delay rail and feeding a signal forward two stages from the data complement delay rail to the data delay rail.

12. The method of regulating voltage of claim 10, wherein the delay chain includes cross-coupled inverters that are at least ten times the size of inverters in the data and data complement delay rails, the cross-coupled inverters enhancing the rate at which the data signal wavefront propagates through the delay chain.

13. The method of regulating voltage of claim 10, wherein initializing the data signal wavefront includes converting a single-ended data input to a data and data complement signal pair.

14. The method of regulating voltage of claim 13, wherein initializing the data signal wavefront is accomplished by an initialization circuit that is calibrated to convert the data input signal to the data and data complement pair prior to an occurrence of a clock pulse that is used to trigger the sampling of the delay chain.

15. The method of regulating voltage of claim 10, wherein sampling the delay chain includes triggering a flip-flop having a metastability window less than a stage delay of the delay chain.

* * * * *